United States Patent [19]

Vatis et al.

[11] Patent Number: 4,694,254
[45] Date of Patent: Sep. 15, 1987

[54] RADIO-FREQUENCY SPECTROMETER SUBSYSTEM FOR A MAGNETIC RESONANCE IMAGING SYSTEM

[75] Inventors: Dimitrios Vatis; Lowell S. Smith, both of Schenectady, N.Y.

[73] Assignee: General Electric Company, Schenectady, N.Y.

[21] Appl. No.: 743,121

[22] Filed: Jun. 10, 1985

[51] Int. Cl.[4] ............................................. G01R 33/20
[52] U.S. Cl. .................................... 324/309; 324/313; 324/314; 324/322
[58] Field of Search ............... 324/309, 307, 312, 313, 324/314, 318, 322

[56] References Cited

U.S. PATENT DOCUMENTS

| 4,361,807 | 11/1982 | Burl et al. | 324/309 |
| 4,480,228 | 10/1984 | Bottomley | 324/307 X |
| 4,506,223 | 3/1985 | Bottomley et al. | 324/307 X |
| 4,516,075 | 5/1985 | Moran | 324/309 |
| 4,573,015 | 2/1986 | Abe et al. | 324/313 X |
| 4,585,992 | 4/1986 | Maudsley et al. | 324/312 X |

Primary Examiner—Tom Noland
Attorney, Agent, or Firm—Geoffrey H. Krauss; James C. Davis, Jr.; Marvin Snyder

[57] ABSTRACT

A radio-frequency (RF) spectrometer subsystem, for a nuclear magnetic resonance spectroscopy and imaging system, provides high-power RF pulse signals each having an envelope of minimum distortion; a portion of the actual RF magnetic field, in the sample-examination volume, is returned to the spectrometer for subsequent correction of the RF signal characteristics responsive to a comparison of the RF magnetic field sample waveform to the requested pulse envelope waveform.

20 Claims, 23 Drawing Figures

ASSEMBLE FIG.s
2a THRU 2d
AS SHOWN

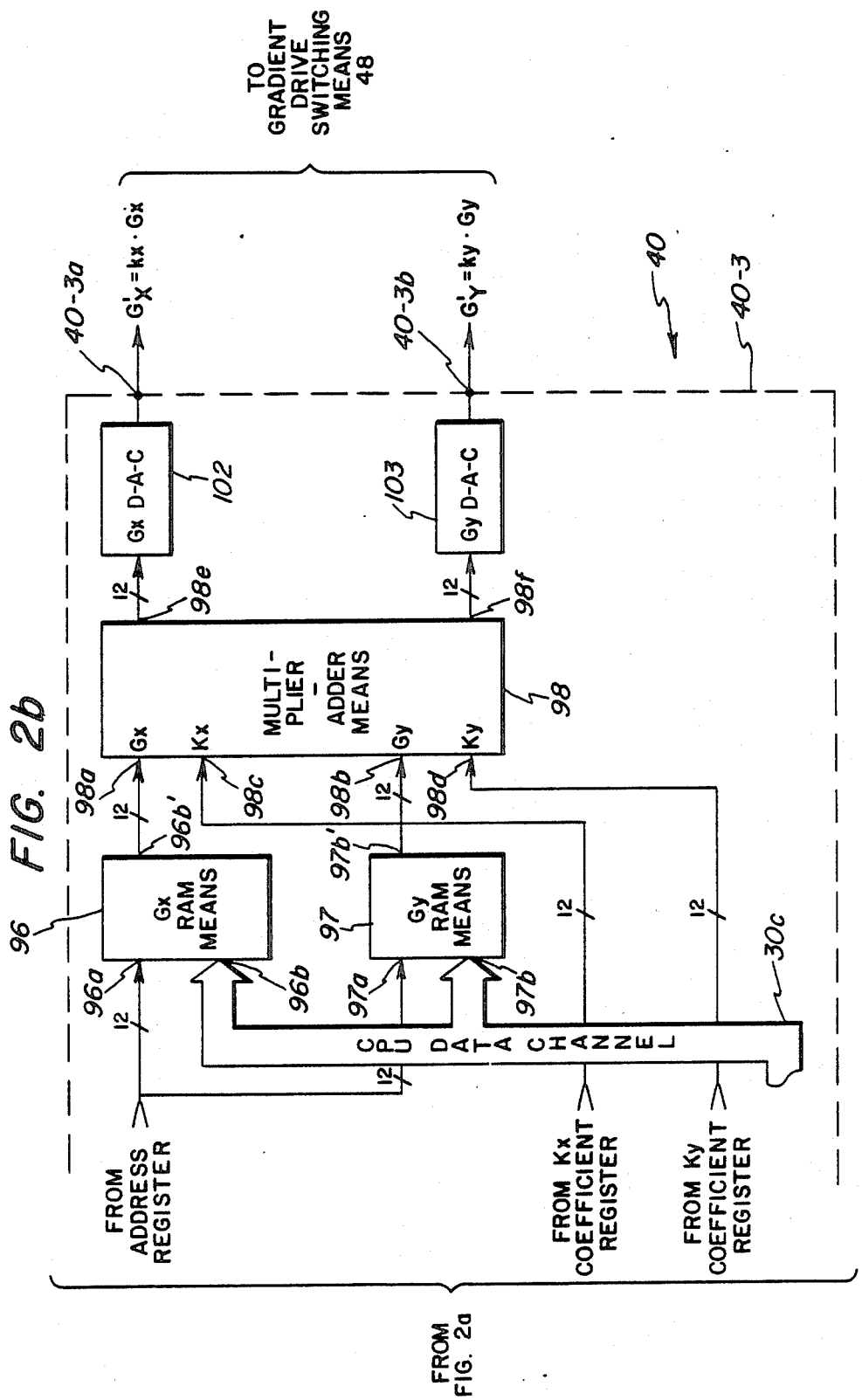

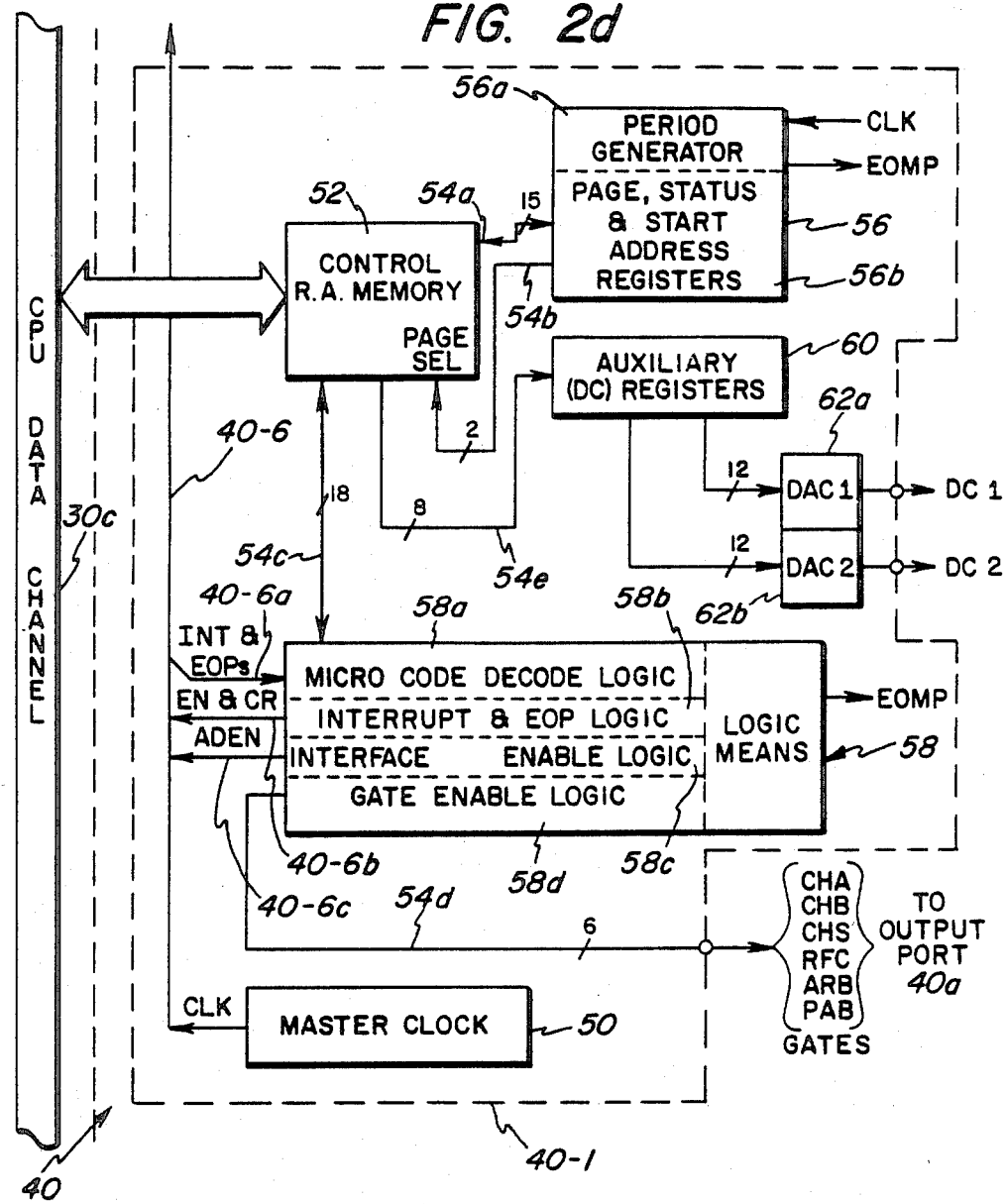

RADIO-FREQUENCY SPECTROMETER SUBSYSTEM FOR A MAGNETIC RESONANCE IMAGING SYSTEM

RELATED APPLICATIONS

This application is related to co-pending applications Ser. Nos. (714,405) and (714,406) and now U.S. Pat. No. 4,602,226, both filed Mar. 21, 1985, and to Ser. Nos. (743,125), (743,119) and (743,115), filed on even date herewith, all assigned to the assignee of the present application and all incorporated herein by reference in their entireties.

BACKGROUND OF THE INVENTION

The present invention is directed to nuclear magnetic resonance imaging and spectroscopy systems and, more particularly, to a novel radio-frequency (RF) spectrometer subsystem for use in an imaging and spectroscopic nuclear magnetic resonance (NMR) system.

The nuclear magnetic resonance phenomenon occurs in atomic nuclei having an odd number of protons and/or neutrons. Each such nucleus has a net magnetic moment such that when placed in a static homogeneous magnetic field, denoted $B_0$, a greater number of the involved nuclei become aligned with the $B_0$ field to create a net magnetization, denoted M, in the direction of the $B_0$ field. The net magnetization M is the summation of the individual nuclear magnetic moments. Because a nuclear magnetic moment is the result of a nuclear spin, the terms "nuclear moment" and "nuclear spin" are generally used synonymously in the art.

Under the influence of the static homogeneous magnetic field $B_0$, the nuclei process, or rotate, about the axis of the $B_0$ field and hence the net magnetization M is aligned with the $B_0$ field axis. The rate, or frequency, at which the nuclei precess is dependent upon the strength of the total magnetic field applied to a particular nucleus, and upon the characteristics of the nuclei specie being subjected to the total magnetic field. The angular frequency of precession, $\omega$, is defined as the Larmor frequency, in accordance with the equation: $\omega = \gamma B_0$, wherein $\gamma$ is the gyromagnetic ratio (and is constant for each nucleus type) and $B_0$ is the strength of the total applied magnetic field to the particular nucleus. Thus, the frequency at which the nuclei precess is primarily dependent upon the strength of the total magnetic field $B_0$; the Larmor frequency increases with increasing total magnetic field strength.

A precessing nucleus is capable of resonantly absorbing electromagnetic energy. The frequency of the electromagnetic energy needed to induce resonance is the same Larmor frequency as the precession frequency $\omega$. During the application of electromagnetic energy, typically by a pulse of radio-frequency (RF) energy, the net magnetization M precesses further away from the $B_0$ field axis (arbitrarily assumed to be the Z-axis of a Cartesian coordinate system), with the amount of precession dependent upon the energy and duration of the RF pulse. A "90°" RF pulse is defined as that pulse of RF energy causing the magnetization M to nutate through an angle of 90° from the direction of the $B_0$ magnetic field, e.g. to move into the X-Y plane (defined by the X-axis and the Y-axis in the Cartesian coordinate system in which the $B_0$ field is aligned along the Z-axis). Similarly, a "180°" RF pulse is defined as that pulse which causes the magnetization M to reverse direction, i.e. move through an angle of 180°, from its original direction (e.g. from the positive Z-axis to the negative Z-axis direction). Following the excitation of the nuclei with RF energy, the absorbed energy is re-radiated as an NMR response signal, as the nuclei return to equilibrium. The re-radiated energy is both emitted as radio waves and transferred to molecules, of the sample being investigated, surrounding each re-radiating nucleus.

NMR response signals originating at different spatial locations within the sample can be distinguished by causing their respective resonant frequencies to differ in some predetermined manner. If one or more magnetic field gradients are applied to the sample, and if each gradient field is of sufficient strength to spread the NMR response signal spectra in a predetermined manner, then each nuclear spin along the direction of at least one of the field gradients experiences magnetic field strength different from the magnetic field strength experienced by other nuclear spins, and therefore resonates at a Larmor frequency different from that of other nuclear spins, as predicted by the Larmor equation. Spatial position of each nucleus contributing to the total NMR response signal can be determined by Fourier analysis, when coupled with knowledge of the applied magnetic field gradient configuration.

The return of nuclear spins to equilibrium, following RF excitation, is referred to as "relaxation". The relaxation process is characterized by two time constants, $T_1$ and $T_2$, both of which are measures of motion on the molecular level. The spatial distribution of the $T_1$ and $T_2$ constants throughout the sample provides information as to the coupling, or interaction, of the nuclei with their surroundings ($T_1$) or with each other ($T_2$) and both provide useful imaging information.

The time constant $T_1$ is referred to as the "longitudinal", or "spin-lattice", NMR relaxation time, and is a measure of time required for the magnetization M to return to equilibrium; that is, time constant $T_1$ measures the tendency of the nuclear spins to realign themselves with the total field $B_0$, after cessation of RF excitation which has moved the spins away from the $B_0$ field direction. The rate of return to equilibrium is dependent upon how fast the stimulated nuclei can transfer energy to the surrounding sample material, or sample lattice. Time constant $T_1$ can, for proton ($^1$H) NMR vary from a few milliseconds in liquids to several minutes or hours in solids. In biological tissue, the typical range of time constant $T_1$ is from about 30 milliseconds to about 3 seconds.

The time constant $T_2$ is referred to as the "transverse", or "spin-spin", relaxation time and is a measure of how long the excited nuclear spins oscillate in phase with one another. Immediately after an RF excitation pulse, the nuclear spins are in phase and precess together; however, each nuclear spin behaves like a magnet which generates a magnetic field that affects other spinning nuclei in its vicinity (generating spin-spin interaction). As each nuclear moment experiences its own slightly different magnetic field, due to the spin of adjacent nuclei, that magnetic moment will precess at a different rate and dephase with respect to the other spins, thereby reducing the observable NMR response signal with a time constant $T_2$. Time constant $T_2$ can vary from a few microseconds in solids to several seconds in liquids, and is always less than or equal to time constant $T_1$. In biological tissue, the typical range of time constant $T_2$, for $^1$H NMR, is from about 5 milliseconds to about 3 seconds.

If the static magnetic field $B_0$ itself has inherent inhomogeneities, as is typically the case with a field generated by a practical magnetic, these inherent inhomogeneities produce additional dephasing action, which hastens the decay of the NMR signal. This additional dephasing action occurs because nuclear spins in different spatial locations are exposed to slightly different magnetic field values and therefore resonate at slightly different frequencies. This new relaxation time, which includes the effects of magnetic inhomogeneities, is generally designated $T_2^*$ ($T_2$ star), where $T_2^* \leq T_2$.

In addition to the effect of spin time constants upon the magnitude of the RF energy re-radiated from a particular nuclei, the frequency of the RF electromagnetic energy re-radiated from any particular nuclei can also be affected by local chemical shifts. Chemical shifts occurs where the NMR frequency of resonant nuclei, of the same type in a given molecule, differ because of the different magnetic environments, which are themselves produced by differences in the chemical environment of each of the multiplicity of nuclei. This chemical environment difference may occur, for example, due to electrons partly screening the nucleus of a particular atom from the magnetic field; the nucleus therefore has a somewhat-reduced resonant frequency due to the somewhat-reduced total magnetic field to which that nucleus is subjected. The degree of shielding caused by electrons depends upon the total environment of the nucleus, and therefore the chemical-shift spectrum of a given molecule is unique and can be utilized for identification. Because the resonant frequency (and therefore the absolute chemical shift) is dependent upon the strength of the total applied field, the chemical-shift spectrum is generally expressed as a fractional shift, in parts-per-million (ppm), of the NMR frequency, relative to an arbitrary reference compound. Illustratively, the range of chemical shifts is about 10 ppm for protons ($^1H$) to about 200 ppm for carbon ($^{13}C$); other nuclei of interest, such as phosphorous ($^{31}P$) for example, have intermediate chemical shift ranges, e.g. 30 ppm. In order to perform chemical-shift spectroscopy, in which such small chemical shifts are discernible, the homogeneity of the static $B_0$ magnetic field must be better than the differences in chemical shifts of the spectral peaks to be observed, and is typically required to be much better than one part in $10^6$ (1 ppm).

Thus, nuclear magnetic resonance investigation offers two non-invasive probes for detection and diagnosis of disease states in an organic sample: proton ($^1H$) magnetic resonance imaging, which can provide images of the internal human anatomy with excellent soft-tissue contrast brought about by the relatively large differences in NMR relaxation times; and localized phosphorous ($^{31}P$) and carbon ($^{13}C$) chemical-shift spectroscopic imaging to provide direct access to metabolic processes for the assessment of damaged tissue and its response to therapy. In addition, the feasibility of imaging natural-abundance sodium ($^{23}Na$) and artifically-introduced fluorine ($^{19}F$) has recently been demonstrated and may find clinical applications in the near future. It is well known that the magnetic field requirements for $^1H$ imaging can be met at static field strengths below 0.5 Tesla (T) and that spectroscopy typically requires a magnetic field strength in excess of 1 T, with a much higher degree of homogeneity across the examination region than required for imaging. It is also well known that the signal-to-noise ratio of the NMR signal improves with increasing magnetic field strength, if the rest of the NMR system is optimized. It has been widely speculated, in the literature of the art, that human head and body proton imaging is not feasible above a main field strength of about 0.5 T, owing to the dual problems of RF field penetration into the sample to be investigated and to the difficulty of NMR coil design, at the relatively high NMR frequencies associated with the higher-magnitude static fields. Therefore, by at least implication, a single magnetic resonance system having a single high magnetic field magnitude, in excess of about 0.7 T, for producing proton images and localized chemical-shift spectra from anatomical samples, such as the head, limbs and body of human beings, has been considered experimentally incompatible. A system enabling the performance of both high-field NMR imaging and chemical-shift spectroscopy for medical applications with the human body, and for the analysis distribution of non-ferromagnetic samples (e.g. for analysis and distribution of hydrocarbon deposits and oil-bearing shale sediments, for general morphological and chemical analysis of heterogeneous non-ferromagnetic samples, and the like) has been developed. A radio-frequency (RF) spectrometer subsystem for providing excitation pulses with frequency and time characteristics essentially as programmed, and for processing the response RF signals to obtain useful data, is highly desirable.

BRIEF SUMMARY OF THE INVENTION

In accordance with the invention, a novel radio-frequency spectrometer subsystem for a nuclear magnetic resonance system for the production of images and localized chemical-shift spectra from a non-ferromagnetic sample, and having means for providing an RF magnetic field within a magnetic means bore and in the sample contained therein, responsive to a modulated radio-frequency excitation signal and also having means for receiving radio-frequency energy re-radiated from the sample for forming a response signal, comprises: transmitter means for providing a first signal with desired amplitude, frequency, phase and the like characteristics; means for amplifying said first signal to the amplitude required of said excitation signal; linearizing means coupled to said amplifying means for minimizing any change in the relative characteristics of any portion of the amplified signal, with respect to any other portion of that signal, to the relative characteristics of the same portions of said first signal; means for providing at least one reference signal for obtaining phase information, noise reduction and/or coherent detection of the received response signal; and means for then converting the received response signal to at least one video signal for analysis.

In presently preferred embodiments of our novel RF spectrometer subsystem, means are provided for: utilizing a single RF antenna for both transmission of an excitation signal and reception of associated response signals; utilizing a secondary antenna to provide a feedback signal to the linearizer means, for minimizing amplitude non-linearities in the increased-amplitude excitation signal, with respect to the first signal; and linearizing means for use with non-single-sideband, single-sideband or all general types of first and excitation signals, with or without comparison to the original modulation signal pulse-shape waveform or with detection of the first signal waveshape for comparing against the actual excitation RF magnetic field adjacent to the sample to be imaged.

Accordingly, it is one object of the present invention to provide a novel RF spectrometer subsystem for a nuclear magnetic resonance system.

This and other objects of the invention will become apparent to those skilled in the art, upon a perusal of the following detailed description, when considered in conjunction with the drawings.

BRIEF SUMMARY OF THE DRAWINGS

FIGS. 4a-1 and 4a-2 form a schematic diagram of one presently preferred embodiment of the linearizer of FIG. 4;

DETAILED DESCRIPTION OF THE INVENTION

In order to provide a background against which an understanding of the requirements and accomplishments of our novel RF spectrometer subsystem can be appeciated, a nuclear magnetic resonance system, and several portions thereof, will be first described. Additional details, if required, may be had by reference to the above-mentioned related applications.

THE NMR SYSTEM

Figure 1:
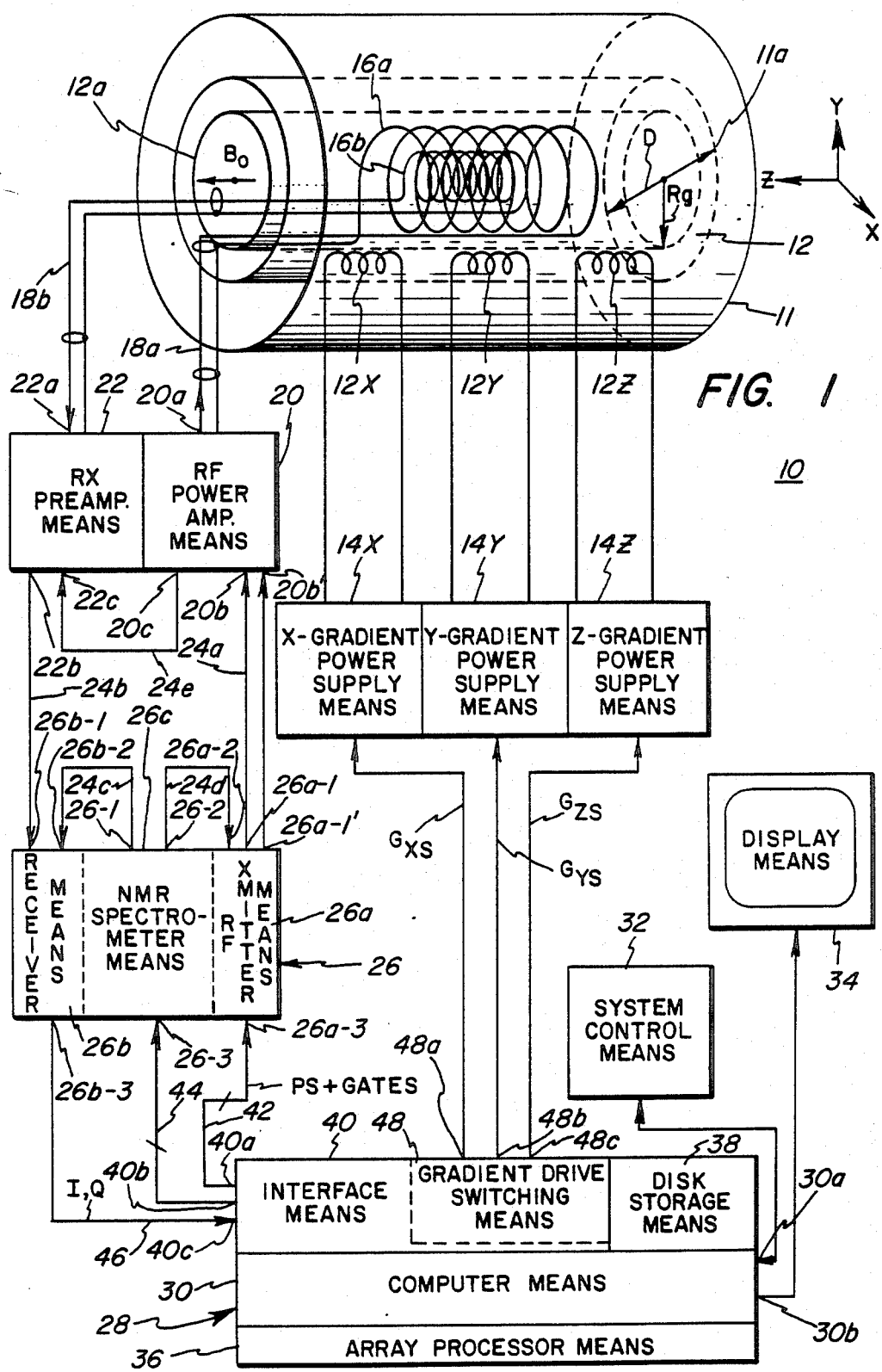
FIG. 1 is a schematic block diagram of an NMR system using our novel RF spectrometer system.
Figure 1A:
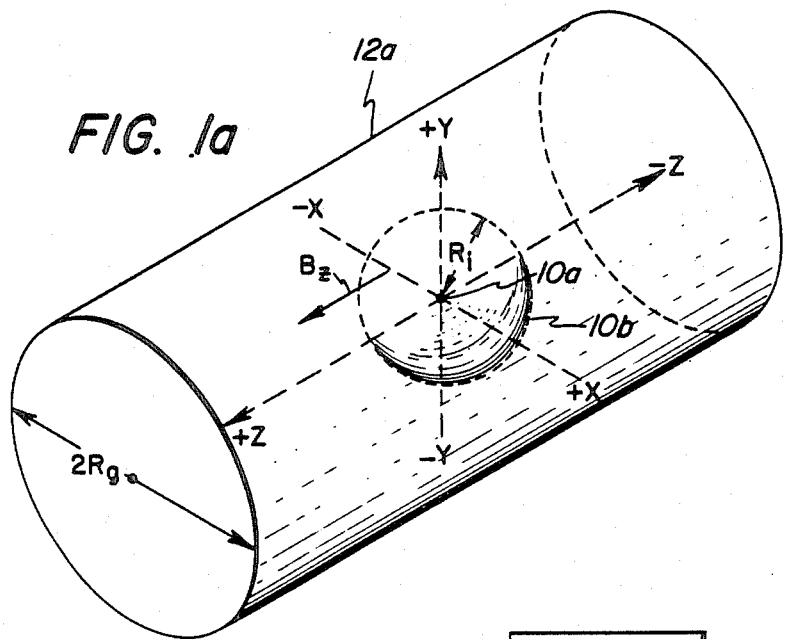
FIG. 1a is a perspective view of the bore of the NMR system magnet means, defining the various imaging coordinates and volumes.

Referring initially to FIGS. 1 and 1a, magnetic resonance imaging and spectroscopy system 10 utilizes a superconducting magnet means 11 having a room-temperature inner bore 11a of a diameter D. Magnet means 11 provides a single static magnetic field $B_0$ along the axis of the cylindrical bore 11a; the magnitude of field $B_0$ must be sufficiently high, e.g. not less than about 0.7 Tesla (T), to facilitate production of localized chemical-shift spectra and has an upper limit, e.g. presently about 4 T, established only by available magnet technology for providing a high-field magnet having a useable bore diameter D. By way of example only, magnet means 11 may be a superconducting magnet, available from Oxford Instruments Co. of England, having main magnet coils and a set of a plurality of correction coils immersed in liquid helium, with another set of a plurality of resistive correction coils. The resulting room-temperature free bore 11a has an axial static field $B_0$ of high spatial and temporal linearity and stability. The static magnetic field $B_0$ is assigned to the Z axis of a three-dimensional Cartesian coordinate system, wherein the X and Y directions are orthogonal to one another and to the Z axis.

Within the magnet means free bore 11a are gradient coil means 12 for generating a set of linear magnetic field gradients in the main static $B_0$ field, relative to the three principal Cartesian coordinate axes. Gradient coil means 12 are typically confined to an annular cylindrical-shaped volume, having a gradient coil means free bore 12a, with a gradient bore radius $R_g$ which is less than the magnet means inner bore radius (i.e. $R_g$ is less than $D/2$). Within the annular cylindrical volume, disposed with its axis along the Z axis of the magnet means free bore, are disposed suitable means for providing a magnetic field gradient in each of the three Cartesian coordinate axes; the three gradient field-forming means are schematically illustrated as coil means 12X for forming a magnetic field gradient $G_X(=\delta B_0/\delta x)$ relative to the X coordinate axis, coil means 12Y for forming a magnetic field gradient $G_Y(=\delta B_0/\delta y)$ relative to the Y coordinate axis, and coil means 12Z for forming a magnetic field gradient $G_Z(=\delta B_0/\delta z)$ relative to the axial Z coordinate axis. While coil means 12X, 12Y and 12Z are schematically shown as having common axes, it should be understood that this positioning is for purposes of diagrammatic simplicity only; the actual position and type of gradient field generating means is well known to the magnetic resonance imaging art. The only requirement of gradient coil means 12X, 12Y and 12Z is that the means utilized be capable of generating magnetic field gradients in the main applied field $B_0$, which magnetic field gradients may be linear, or otherwise, with respect to the Cartesian coordinate axis associated with each gradient coil means and which magnetic field gradient may be pulsed, or otherwise modulated, as required for the particular magnetic resonance experiment to be conducted.

The magnet means 11 and gradient coil means 12 thus provide a total magnetic field $B_Z$ (FIG. 1a) within the gradient coil means free bore 12a, which total field $B_Z$ is a summation of four separate fields: the static field $B_0$ in the Z axial direction, and gradient fields in the X, Y and Z directions which typically vary linearly with distance along the associated axis. Thus, the total $B_Z$ field is given by:

$$B_Z = B_0 + G_X \cdot x + G_Y \cdot y + G_Z \cdot z,$$

where $G_X = (\delta B_Z/\delta x)$, $G_Y = (\delta B_Z/\delta y)$ and $G_Z = (\delta B_Z/\delta \Delta z)$, as where $G_X$, $G_Y$ and $G_Z$ can be of either polarity. The origin 10a of the Cartesian coordinate system is usually chosen as the center of the region of highest homogeneity of the main static field $B_0$. As shown in FIG. 1a, this point usually corresponds substantially to the midpoint along the length of the bore in each of the three Cartesian directions, although it should be understood that, by variation of the ratio of currents in different portions of each of the $G_X$, $G_Y$ and $G_Z$ gradient coil means, the center 10a of a sample sphere 10b can be moved to any desired location within the imaging cylinder 12a. The sample sphere 10b has a radius $R_i$ determined by the particular form of magnetic resonance experiment being carried out.

For a system utilizing the illustrated Cartesian coordinates, with the gradient field in the direction of each axis being associated with a set of gradient coil means, a separate one of a plurality of gradient power supply means 14 is utilized to establish the gradient current through each associated axis coil means responsive to the instantaneous value of a gradient signal $G_{AS}$, where A is the particular axis direction. Thus, an X-gradient power supply means 14X supplies to the X-axis gradient coil means 12X a $G_X$-gradient-forming current of magnitude and polarity determined by the magnitude and polarity of an input gradient $G_{XS}$ signal; a Y-gradient power supply means 14Y supplies to the Y-axis gradient coil means 12Y a $G_Y$-gradient-forming current of magnitude and polarity determined by the magnitude and polarity of an input gradient $G_{YS}$ signal; and a Z-gradient power supply means 14Z supplies to the Z-axis gradient coil means 12Z a $G_Z$-gradient-forming current of magnitude and polarity determined by the magnitude and polarity of an input gradient $G_{ZS}$ signal. Each of the gradient-forming signals $G_{XS}$, $G_{YS}$ and $G_{ZS}$ is typically of pulsed nature. The transfer function of each of the gradient power supply means and its associated gradient coil can be made perfectly linear, whereby a perfectly linear gradient magnetic field is provided for a perfectly linear gradient power supply means input signal, or can be non-linear in any desired monotonic manner.

The total magnetic field $B_Z$ acting on each small volume element (voxel) of the sample establishes the exact Larmor frequency of that small volume in conjunction with the gyromagnetic constant $\gamma$ for a particular nuclei species being investigated. That is, a particular species of nuclei, all of which are bound in the same chemical environment, will have identical Larmor frequencies in a uniform magnetic field, but, responsive to the changing magnetic field provided by the field gradients, will have Larmor frequencies occurring over a range, responsive both to the gradient magnitude and polarity and to the position of the volume element containing the radiating nuclei within the total field. The nuclei are initially stimulated by excitation radio-frequency (RF) energy at their Larmor frequencies as determined by the species gyromagnetic constant and the net field $B_Z$ which, in general, varies over the sample volume due to the application of the gradient fields; this RF energy enters the sample from an RF magnetic field provided by an excitation antenna 16a. The RF energy is provided to antenna 16a via an excitation cable 18a, typically of coaxial construction, from the output 20a of an RF power amplifier means 20. Responsive to the excitation RF magnetic field, the various small nuclei voxels each reradiate an RF signal at the Larmor frequency determined by the total instantaneous field magnitude at the species sample location. This reradiated signal is received by a reception antenna 16b and is provided via a cable 18b, also typically of coaxial construction, to the input 22a of a reception RX preamplifier means 22. Excitation antenna 16a and reception antenna 16b may both surround the anatomical sample being investigated and are always placed within the magnet means bore 10a. Because the gradient coils 12 are typically of a size to provide imaging gradients for the largest of samples to be accommodated, the antennae 16 are typically placed within the free bore 12a of the gradient coils. Further, it is often desirable when providing antennae 16 wound on cylindrical coil supports concentric with the magnet axis Z, to have the excitation antenna 16a of somewhat greater diameter than the reception coil 16b, to provide a desired uniformity of excitation RF magnetic field across the sample volume to be investigated. It should be understood that a large variety of forms of excitation and/or reception antennae are known and any such form utilizable at Larmor frequencies associated with imaging and/or spectroscopy experiments can be used; considerations of spatial and temporal linearity and stability, as well as sensitivity, may affect the choice of a particular antenna, or antennae, for a particular experiment.

RF power amplifier means 20 supplies the excitation signal responsive to a first, or transmitter, RF signal provided at the power amplifier means input 20b, via a cable 24a, from the RF output 26a-1 of an RF transmitter means portion 26a, forming part of an NMR spectrometer 26. For $^1H$ whole-body NMR imaging, typical pulsed RF power requirements are 1 KW.–10 KW. for up to 4 milliseconds duration, with up to 10% duty cycle; negligible leakage (e.g. 60 dB. "off" level, below carrier, typical), must be achieved during data acquisition. The RF power amplifier must be operable at all of the desired NMR frequencies. At 1.5 T, these frequencies are about 64 MHz., 59 MHz., 26 MHz., 16 MHz. and 16 MHz., respectively, for respective $^1H$, $^{19}F$, $^{31}P$, $^{13}C$ or $^{23}Na$ nuclei. The signal at transmitter means portion output 26a-1 is, as further described hereinbelow, provided at an instantaneous frequency determined by the frequency of a signal provided at a second transmitter means portion input 26a-2, and with a modulation envelope of shape and timing determined by RF pulse-shape (PS) determining and gating signals provided at a second RF transmitter means portion input 26a-3.

The response signals received at preamplifier means input 22a are, after low-noise amplification in means 22, provided at an output 22b thereof and coupled, via another cable 24b, to a preamplified signal input 26b-1 of a receiver means portion 26b of NMR spectrometer means 26. Within receiver means portion 26b, the preamplified signal is compared to a local oscillator frequency, provided at a second receiver means portion input 26b-2, to provide a pair of phase-quadrature I and Q signals at a receiver means portion output 26b-3. Power amplifier means 20 provides a gating signal at a third output 20-c, via a cable 24e, to a second input 22c of the preamplifier means 22, for temporarily disabling, and protecting, the preamplifier means whenever an excitation pulse is being provided by power amplifier means 20.

A common portion 26-1 of the NMR spectrometer means 26 not only provides the RF local oscillator signal to the receiver means portion input 26b-2, via a cable 24c from a first RF output 26-1 of the spectrometer common portion 26c, but also provides the same frequency, via another cable 24d from a second RF output 26-2 of common portion 26c, to the transmitter means first input 26a-2. The particular frequency is selected responsive to at least one frequency-determining signal at a control input 26-3 of spectrometer common portion 26c. It will be seen that, while means 26 is denoted as an NMR "spectrometer", this means is used for all NMR experiments, of imaging as well as chemical-shift spectroscopy nature. It should be understood that, because power amplifier means 20 and low-noise preamplifier means 22 are best utilized with relatively short lengths of cables 18a and 18b, these means may not be physically located at the same location as means 26, and are semantically distinguished from the "spectrometer" only to highlight this difference in location; we will refer to the totality of means 20, 22 and 26 as the "NMR Spectrometer Subsystem".

System 10 includes a data processing and control means 28, comprised of a computer means 30, having a first input/output (I/O) port 30a for communications with a systems control means 32 (such as a keyboard device and the like), and an output port 30b for providing video information and the like signals to a display means 34, for providing a temporary display of the information acquired from the anatomical sample being investigated. Data processing and control means 28, in addition to computer means 30, comprises: an array processor means 36 so coupled to computer means 30 as to provide relatively rapid fast Fourier transform (FFT) calculations and the like upon data transferred thereto from the computer means; a disk storage means 38 for providing semi-permanent storage and retrieval of relatively large amounts of digital information (e.g. the sample information from each of a multiplicity of sample experiments); and an interface means 40 serving to interconnect the computer means 30 with the NMR spectrometer means 26 and the plurality of gradient power supply means 14.

Interface means 40 has a first output port 40a for providing, via a plurality of signal-carrying conductors 42, the various pulse-shape-determining and pulse gate signals to be transmitted to the control input 26a-3 of transmitter means portion 26a. A second interface means output port 40b provides, via a plurality of conductors 44, the relevant computer data channel signals to spectrometer input 26-3 for establishment of spectrometer frequencies and the like common information. An interface means first input port 40c receives, via a plurality of cables 45, the quadrature I and Q signals from the output 26b-3 of receiver means portion 26b. Interface means 40 also, advantageously, comprises a gradient drive switching means 48 which receives information describing the gradient magnetic fields to be established within the gradient coil bore 12a and provides the proper gradient drive signals $G_{XS}$, $G_{YS}$ and $G_{ZS}$ at the respective gradient drive signal output ports 48a, 48b and 48c to the respective X-gradient power supply means 14X, Y-gradient power supply 14Y and Z-gradient power supply means 14Z.

Figure 2:
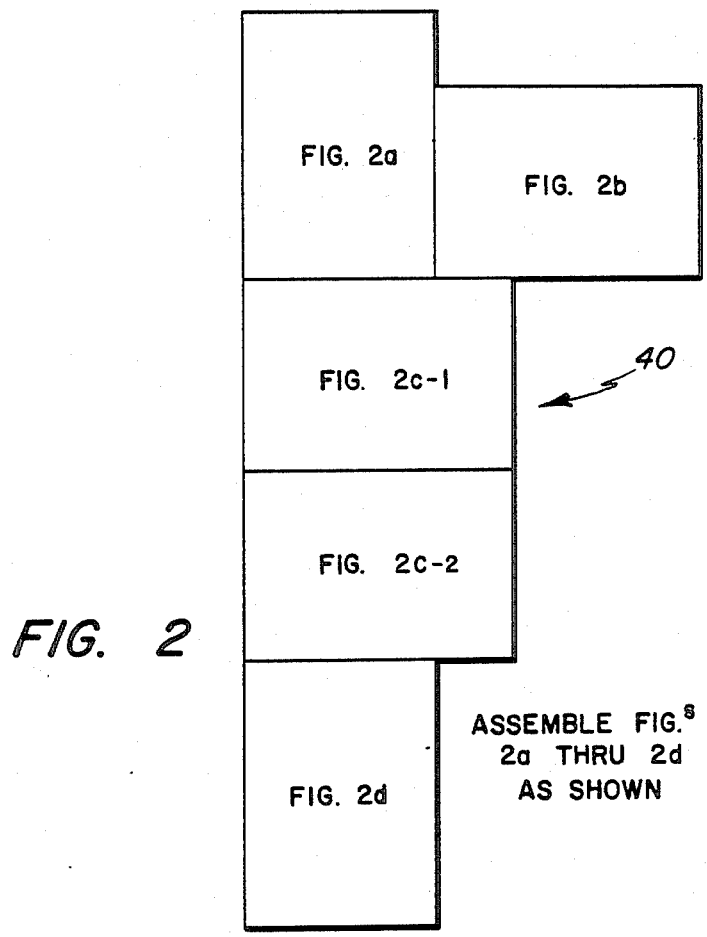
FIG. 2, comprised of the schematic block diagrams of FIGS. 2a-2d, illustrates a presently preferred embodiment of an interface means for use in the NMR system of FIG. 1.

In order to appreciate the apparatus used for the generation of particular excitation signal waveshapes or for the processing of received MR response signals, and the like, in the RF spectrometer subsystem, relevant portions of the interface means will be described, with reference to FIGS. 2a-2d, joined together as shown by FIG. 2, and to FIG. 2e. Interface means 40 receives digital information from the computer means central processor unit (CPU) data channel 30c for providing (in addition to gradient field signal waveforms $G'_X$, $G'_Y$ and one of a pair of Z-gradient-field signal waveforms $G'_{Z1}$ and $G'_{Z2}$ to means 48) the pulse-shape and gate signal waveforms to output port 40a (and thence to transmitter portion input 26a-3). Frequency and other common information is provided to output port 40b (and thence to spectrometer subsystem input 26-3). The quadrature I and Q video signals provided from receiver portion output 26b-3 are also processed in the interface means. A presently preferred interface means 40 is used with a general-purpose Data General type S/140 minicomputer (computer means 30) and a Floating Point Systems type AB120B high-speed array processor (means 36). Data channel, or bus, 30c is a 16-bit-wide data bus which provides minicomputer-generated data to: an interface master sequencer portion means 40-1; a digitizer portion means 40-2; an interface first-type waveform-generator portion means 40-3; a pair of interface second-type waveform-generator portion means 40-4 and 40-5; and to the interface means second output port 40b. Interface means 40 also comprises an interface means internal data bus 40-6 having a plurality of conductors interconnecting the master sequencer portion means 40-1 with, and for control of, digitizer portion means 40-2 and waveform-generator portion means 40-3, 40-4 and 40-5. Bus 40-6 is implemented as a 35-bit-wide bus in the illustrated embodiment.

Master sequencer portion means 40-1 has a master clock means 50 for providing an internal clock (CLK) signal periodic waveform (illustratively at about 10 MHz.) to all of the interface means portions. A control randam-access memory means 52 stores microcode instructions, downloaded from minicomputer means 30, for controlling the operational sequences of digitizer portion means 40-2 and waveform-generator portion means 40-3, 40-4 and 40-5. The microcode instructions, contained in each one of four 256-word pages of memory means 52, determine the order in which the waveform-generator portions are enabled, the length of various time intervals in the pulse sequence signal waveforms, the controlled flow of operational sequences which require nested or alternative subsequences, data acquisition times and the like. Coupled to CPU data channel 30c and to control memory means 52, via a data bus 54a and a page-selection bus 54b, is a period generator and page, status and start-address registers means 56. A logic means 58 contains four logic portions: a microcode decode logic portion 58a which receives the microcode instructions from memory means 52, decodes the microcode instructions and causes the proper sequence of operations to occur responsive thereto; an interrupt (INT) and end-of-period (EOP) logic portion 58b, which receives INT and EOP signals from a portion 40-6a of the interface internal bus; an interface enable logic portion 58c, which provides enable (EN) and continuous-run (CR) signals to the waveform-generator portions 40-3 through 40-5, via a portion 40-6b of the interface means bus, and provides a digitizer portion means 40-2 enable (ADEN) signal via another interface means bus portion 40-6c; and a gate enable logic portion 58d which provides the six gate signals (signals CHA, CHB, CHS, RFC, ARB and PAB), as hereinbelow further explained, on a six-connection bus 54d to interface means output port 40a and thence to the spectrometer subsystem.

The 64-bit microcode data word has a format, as shown in FIG. 2e, containing five fields. The first 16 bits (i.e. bits b0–b15) form a period generator field which initializes period generator portion 56a to select an output signal waveform of period and/or frequency to be generated during a time interval commencing with the availability of that data word (i.e. when the control memory 52 receives the address of that data word from an register portion 56b) and terminating at the end of the time interval selected by the period generator field for that particular data word. The 16-bit period generator field, coupled with an interval six-decade divider, allows each control memory word to be present during any interval from 0.1 microseconds to at least 409.6 seconds. The enable (EN), interrupt (INT) and synchronization (sync.) field is an 8-bit field (i.e. bits b16–b23) which is further subdivided into 8 single-bit subfields to provide the enable, continuous-run, end-of-period interrupt, accept external synchronization and next control memory word address conditions for a present control data word instruction. Separate data bit subfields are provided to, inter alia, initially enable and/or set for continuous run the XY-gradient generator portion means 40-3; enable the digitizer portion means 40-2; issue an interrupt at any end-of-period (EOP) signal from any of the other interface means portion means 40-2 through 40-5; cause all portion means 40-1 through 40-5 to cease operation upon generation of an EOP signal; cause the master sequencer means control memory address to advance to a selected one of the next address or an alternate control memory address, upon generation of an EOP signal; and similar functions.

Master sequencer portion means 40-1 is thus responsible for performing the following functions:

(1) generating a clock CLK signal (e.g. at 10 MHz.) for synchronization of all interface portion means 40-1 through 40-5;

(2) determining the basic timing relationships between the gradient, gating and other signal waveforms generated by the various interface portion means 40-1 through 40-5;

(3) enabling and disabling other interface portion means 40-2 through 40-5 at specified times;

(4) clocking out "dead" time intervals when none of the other interface portion means 40-2 through 40-5 are enabled;

(5) generating interrupts to the computer means CPU at specified times;

(6) controlling the logic levels of six logic (TTL) gate signals which are used for various system utility functions, such as spectrometer means 26 control, RF excitation signal gating, receiver blanking and the like;

(7) determining whether the system is in a "run" mode wherein waveforms and control signals are being actively generated, or whether the system is in a "dormant" mode wherein those signals are not being generated and interface means 40 is dormant and awaiting instructions from computer means 30, via CPU data channel 30c; and (8) selecting two of a multiplicity of auxiliary DC registers 60 to be gated into the pair of 12-bit DAC means 62 for providing analog signal outputs for use in those parts of the system, such as DC magnet compensation and the like, where response speed is not a critical factor.

In normal operation, the control memory and the page/address registers are downloaded with program information via the CPU data channel 30c. Each control program must fit within one of four 256-word pages, so that four distinct NMR experiment programs can simultaneously reside in the control memory. Upon receipt of a start signal, master sequencer means 40-1 commences operation and the page and starting address information in register portion 56b is used to select the control memory address to provide a first instruction to logic means 58. Once master sequencer means 40-1 is running, computer means 30 can obtain the status thereof from the status registers in portion 56b. Master sequencer means 40-1 enables, responsive to the signals in the various fields of the data word then provided to logic means 58, the various ones of the output signals to be generated from portion means 40-1 through 40-5 and determines the timing of the various signals generated responsive to the present data word. Master sequencer portion means 40-1 will remain at a particular control memory address, and a particular data word will be acted upon, until the interrupt and EOP logic portion 58b receives either an end-of-master-period (EOMP) overflow signal from the period generator portion 56a of master sequencer means 40-1 or an EOP signal from one of the gradient waveform-portion means 40-3 through 40-5. At the occurrence of either event signaling the end of a predetermined time interval, the control memory jumps to a new memory address. While this next address will usually be the next address specified in the data word field of bits b24–b31, the control memory will jump to an alternate address if the "enable alternate address" subfield of the EN, INT and sync. field is enabled and an alternate address has been loaded (via data channel 30c) into an alternate address register in portion 56b, while a previous data word was controlling the master sequencer. If an alternate address has not be loaded, the master sequencer board halts; the system remains in the "run" mode (until turned off by an instruction from computer means 28 to the appropriate register of means 56) thus enabling the computer means to force the master sequencer means to exit an instruction loop without disturbing the system timing.

Figure 2A:
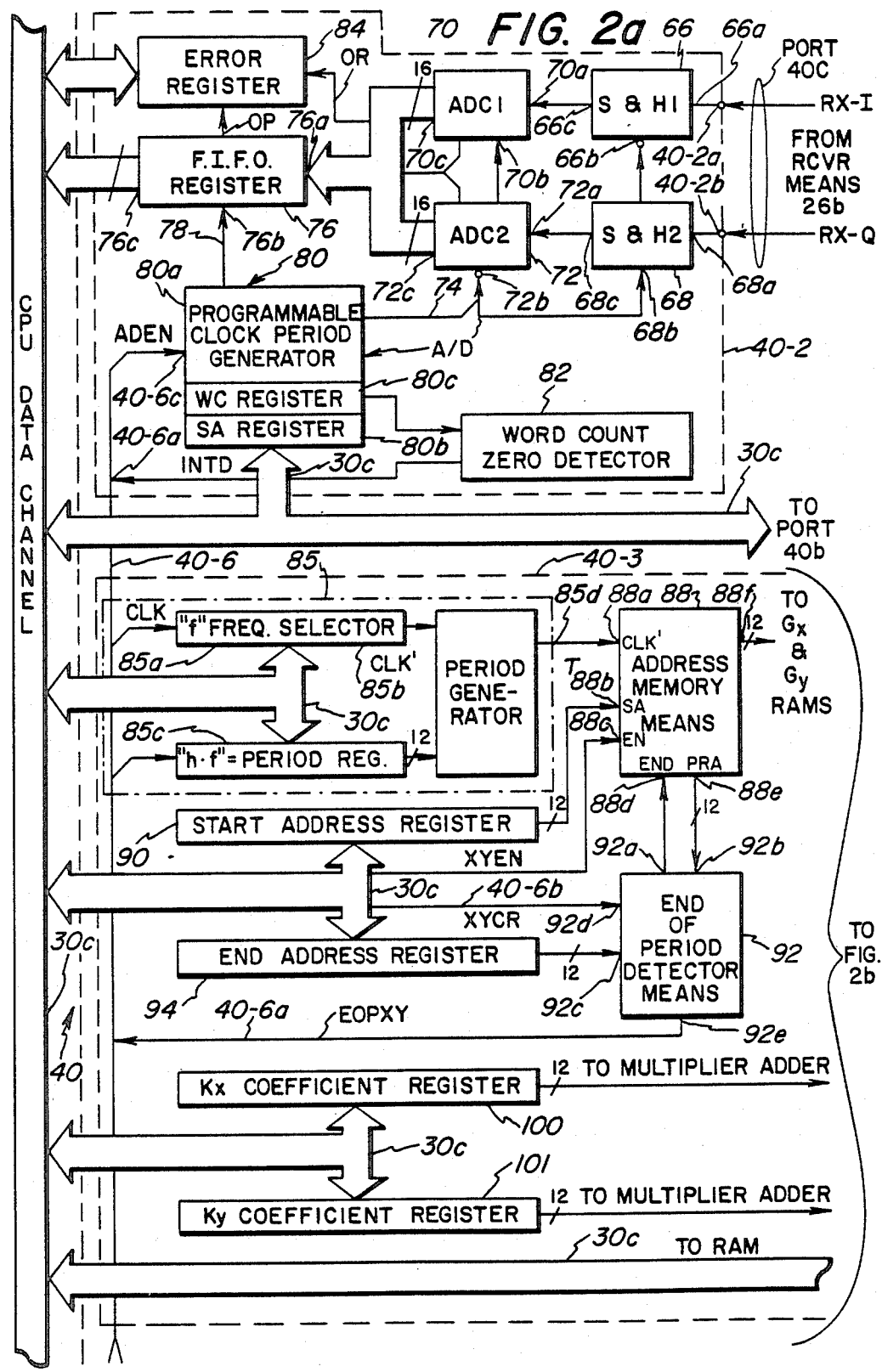
FIG. 2e is a schematic illustration of the 64-bit microcode data word format, a portion of which is transferred via the data bus in the interface means of FIG. 2, and useful in understanding operation of the interface means.

Referring now to FIG. 2a, digitizer portion means 40-2 receives a pair of phase-quadrature I and Q video signals (from receiver means 26b) at interface means input port 40c. The I signal appears at a first digitizer portion means input 40-2a, connected to the input 66a of a first sample-and-hold (S & H1) means 66, while the Q signal appears at a second digitizer portion means input 40-2b, connected to the input 68a of a second sample-and-hold (S & H2) means 68. Each of sample-and-hold means 66 and 68 will, responsive to a predetermined logic state at the associated sample input 66b or 68b, sample the present value of the analog I or Q signal and hold that value at an associated output 66c or 68c, respectively. The held sample I output 66c signal is coupled to the analog input 70a of a first analog-to-digital converter (ADC1) means 70, while the held sample Q output 68c signal is coupled to the analog input 72a of a second analog-to-digital converter (ADC2) means 72. Responsive to the proper state of a signal at the associated one of the conversion control inputs 70b or 72b, ADC1 means 70 or ADC2 means 72 provides a multiple-bit digital data word (corresponding to the magnitude of the respective input analog signal) at an associated output 70c or 72c, respectively. Each of means 70 and 72 is a high-speed 15-bit ADC which, after digitization, provides a data word which is sign-extended to a normal 16-bit two's-complement format. The I and Q channel video information is converted to interleaved digital data words, with the I channel word always "appearing" first at a first-in-first-out (FIFO) register means 76. The interleaved sample/conversion process of the two information channels is carried out responsive to the two logic states of the signal on wire 74. FIFO register means 76 will typically store a plurality P, e.g. P=2 in the illustrated embodiment, of sequential data words; thus, the digital data word does not appear at the register means output 76c, and is not coupled to the CPU data channel 30c, until P 16-bit data words are present in the register (i.e. after one pair of interleaved I and Q channel conversions have occurred).

Control submeans 80 includes not only a programmable clock period generator portion 80a, controlling the time interval between each analog-to-digital conversion, but also includes a starting address register portion 80b and a word count register portion 80c for determining, in conjunction with a word count zero detector means 82, the total number of interleaved conversions required and the completion of that required number of conversions. Since a pair of interleaved conversions occur for each cycle of the logic level waveform on line 74, itself provided as the output of programmable clock period generator portion 80a, the word count (WC) register portion 80c is directly loaded from CPU data channel 30c with the required number of words prior to the enablement of digitizer portion means 40-2. The time interval between line 74 logic state changes is also loaded into programmable clock period generator portion 80a prior to portion means 40-2 enablement. The particular ADC means 70 and 72 utilized in our presently preferred system allow a maximum speed of about $2.5 \times 10^5$ pairs of interleaved data conversions for second or about 4 microseconds per data point, where each data point contains both an I-channel and a Q-channel data word.

In operation, the number of words of interleaved conversions is loaded into the WC register portion 80c and the clock period (a multiple of the minimum conversion time of 4 microseconds) is loaded into programmable clock period generator portion 80a. Thereafter, master sequencer portion means 40-1 generates a digitizer portion means 40-2 enable ADEN signal, which is carried by interface means bus portion 40-6c to generator means portion 80a. Responsive thereto, the clock period generator portion 80a begins to generate logic level changes on line 74. Responsive to the first positive-going logic level change on line 74, storage pulses are generated for that level change and for each level change thereafter, for introduction to storage control input 76b. The initial value $WC_i$ in register 80c is decremented by one for each complete cycle of the clock period generator portion 80a. When the required number of interleaved pairs of conversions have been completed, the value in WC register portion 80c falls to zero and this zero word count register value is detected by zero word count zero detector means 82, which issues a digitizer portion means interrupt (INTD) to interface means data bus portion 40-6a. The INTD signal is transmitted to the interrupt and EOP logic portion 58b of master sequencer logic means 58 to indicate that digitization of the received NMR signal is complete. It should be understood that the use of FIFO register means 76 allows digitizer portion means 40-2 to be relatively permissive of contentions on data channel 30c, with other apparatus of the direct-memory-access type, and conversion data will not be lost as long as the digitizer portion means 40-2 output can be given access to the CPU data channel 30c before register means 76 overflows. As each data word is accepted by the computer means CPU, an acceptance signal can be returned along data channel 30c to an error register means 84. An output present OP signal can be provided at register means output 76c, to error register 84, such that the ignoring of the initial invalid words can be indicated to the CPU. Conversely, acceptance by the CPU of each FIFO register means output word can be signaled. In the event that a valid FIFO register means output word is not accepted by the CPU, an overflow condition is declared by error register means 84 and is signaled back to computer means 30 via CPU data channel 30c. In addition, a second error signal, or bit, is defined by the presence of an overrange OR signal from either of the channel ADC means 70 or 72; the overrange error signal can be utilized to instruct the computer means to forego processing of any overrange (and therefore meaningless) data. In this embodiment, only a word count zero will cause an interrupt (the INTD signal) to be generated, and analog-to-digital data conversion will continue in spite of either, or both, of the buffer overrun or conversion overrange errors, unless the system control program decides otherwise.

Referring now to FIGS. 2a and 2b, the XY waveform-generator portion means 40-3 includes a period generator means 85 similar to the period generators in each of portion means 40-1, 40-2, 40-4 and 40-5. The clock period generator means 85 includes a frequency f selector means 85a which receives the clock CLK waveform from interface means internal bus 40-6 and receives configuring information from the computer means CPU data channel 30c. Frequency selector means 85a generates a periodic divided frequency clock CLK' signal to a first input of a period generator circuit 85b. A second input of period generator circuit 85b receives a 12-bit digital data word establishing the time interval $\tau$ between successive period pulses provided at the pulse generator means output 85d. The 12-bit pulse time interval data word is provided at the output of a period "n·f" register 85c, receiving a 12-bit period-establishing data word from computer means CPU data channel 30c and also receiving a "load" pulse from interface means internal data bus 40-6. The 12-bit data word in period register 85c allows one of 4096 possible values to be chosen for each setting of frequency selector 85a. The frequency selector 85a is provided with three selection data bits, providing eight possible configurations for the CLK' output; the frequency selector is a six-decade frequency divider having a seventh "undivided" selectable output and an eighth "off" selectable output. Thus, the programmable range of period time interval spacings is as shown in the following table:

| PROGRAMMABLE PERIOD GENERATOR OUTPUT PULSE TIMING RANGES | | | |
|---|---|---|---|
| fDATA | DECADE | CLK' FREQ. f | n · f RANGE |
| 000 | 0 | OFF | — |
| 001 | 1 | 10 Hz. | 0.1–409.6 Sec. |
| 010 | 2 | 100 Hz. | 0.01–40.96 Sec. |
| 011 | 3 | 1 KHz. | 1.0 m Sec.–4.096 Sec. |
| 100 | 4 | 10 KHz. | 100 μSec.–409.6 m Sec. |
| 101 | 5 | 100 KHz. | 10 μSec.–40.96 m Sec. |
| 110 | 6 | 1 MHz. | 1 μSec.–4.096 m Sec. |
| 111 | 7. | 10 MHz. | 0.1 μSec.–409.6 μSec. |

The periodic pulses at period generator means output 85d are used to provide a 12-bit address word at memory means output 88f to the address inputs 96a and 97a, respectively, of an X-gradient $G_x$ random access memory (RAM) means 96 and a Y-gradient $G_y$ RAM memory means 97, respectively. Data can be loaded into RAM memory means 96 and 97 via the CPU data channel 30c connection to the RAM means data and control inputs ports 96b and 97b, respectively. The respective X-gradient G'$_X$ signal and Y-gradient G'$_Y$ signal are provided at the first waveform-generator portion means outputs 40-3a and 40-3b, respectively, as audio-frequency analog signals having a maximum ±10-volt amplitude; these signals are coupled to gradient drive switching means 48.

In operation, the XY waveform-generator portion means 40-3 has two basic operating modes: the "load" mode and the "run" mode. In the "load" mode, gradient waveforms are not being generated and all of the computer means-accessible registers and memories (e.g. registers and/or memories 85a, 85c, 90, 94, 96, 97, 100 and/or 101) can have data read therefrom or written thereto by the computer means central processing unit, via data channel 30c. The "load" mode corresponds to the "XY enable" signal XYEN being in a logic 0 condition. When XYEN is in a logic 1 condition, the XY waveform-generator portion means 40-3 is in the "run" mode. Assuming that the appropriate frequency f, period n·f, start address SA and end address EA information has been previously loaded into respective frequency selector register means 85a, period register means 85c, start address SA register means 90 and end address register means 94a, that the necessary $G_x$ and $G_y$ data has been loaded into memory means 96 and 97, respectively, and the required $K_x$ and $K_y$ coefficient information has been entered into registers 100 and 101, then the appearance of a logic 1 XYEN signal causes the following operations to occur: the start address SA data is loaded into address memory means 88; the end address data is loaded into end-of-period detector means 92; and period generator means 85 begins to produce CLK' pulses each occurring τ seconds apart. Each of the start and end addresses represents one of the 2048 possible addresses in address memory means 88. Responsive to the XYEN signal, the first, starting address SA is provided at memory means output 88f, to the RAM means 96 and 97. The data previously stored therein at the first address is made available to the $G_x$ and $G_y$ inputs 98a and 98b, respectively, of means 98, and is individually multiplied by the appropriate $K_x$ or $K_y$ coefficient from the associated one of registers 100 or 101. The resulting gradient data is transformed into an analog level by the associated one of DAC means 102 or 103 and appears at the associated one of outputs 40-3a or 40-3b. Responsive to the first pulse from period generator means output 85d, the address of memory means 88 is advanced to the next address stored therein. This new present address PRA data word is checked by the end-of-period detector means 92 against the end address data word stored in register means 94. If the present address of address memory means 88 does not match the end address of register 94, the end-of-period detector means 92 does not send an "end" signal to memory means input 88d. The new address data is provided to memory means 96 and 97 and the associated waveform data at the second requested address in each RAM means is sent to the multiplier means 98, with the new scaled waveform data being converted into the associated analog levels for appearance at the portion means outputs. The address memory means continues to provide new addresses, sweeping out the range from the start address, contained in register 90, to the end address, contained in register 94, to determine the X and Y gradient output signal waveforms. If the stop address is numerically less than the start address, the address memory means will increment from the start address until the highest address in memory means 88 is reached and will then "wrap around" to address zero and continue to increment the address memory means address data until the "end address" is reached. This "wrapping around" facility does not affect any end-of-period condition for the XY portion means 40-3. The actual end-of-period EOPXY signal will be sent from means 92 only when the present-address PRA data received from address memory means output 88e is equal to the end address data received at input 92c from register means 94. The time that is required to traverse the range of addresses from the start address to the end address is the product of the address range to be stepped through and the time interval τ between successive-address-enabling pulses from period generator means output 85d. Unless the continuous run XYCR signal is at a high logic level, each time the address memory means has advanced to the end address the end-of-period detector means 92 sends the EOPXY signal to the master sequencer portion means 40-1, and address memory means 88 is reloaded, by the appearance of an "end" signal at input 88d (from end-of-period detector means output 92a) to the start address presently contained in register means 90. Thereafter, the master sequencer portion means control memory 52 determines subsequent activity of the XY waveform-generator portion means 40-3. That is, the master sequencer control memory reacts to the EOPXY signal (or, alternatively, to any other EOP signal) by incrementing to its next control memory address. At this next control memory address, the contents of the 64-bit control memory data word will determine, for example, whether the XY waveform-generator portion means is again to receive an XYEN enabling signal to cause this portion means to once more begin to sweep out the memory addresses (and therefore the gradient signal waveforms) presently contained therein. If the XY waveform-generator portion means is not enabled, all activity in portion means 40-3 ceases until the master sequencer portion means once again sends the enabling XYEN signal.

If, however, the present master sequencer control word is such that a XY waveform-generator portion means continuous-run (XYCR) signal is present at detector means input 92d, then the end-of-period detector means 92 is inhibited from sending the EOPXY end-of-period signal when the ending address is present in address memory means 88. However, the auto-reload of the start address SA data from register means 90 into address memory means input 88b will still occur and therefore the XY waveform-generator portion means will continuously sweep out the address range from the previously-loaded "start address" to the previously-loaded "end address", until the XYEN enabling signal falls to a low logic level for any reason.

While the address memory means output 88f data word sweeps from the starting address to the ending address, as controlled by enabling continuous-run signal, the associated addresses in the $G_x$ and $G_y$ RAM means 96 and 97 are cyclically swept out. This provides a changing sequence of 12-bit data words to the $G_x$ and $G_y$ inputs of multiplier means 98. Each of the $G_x$ and $G_y$ actual data words are multiplied by the appropriate $K_x$ or $K_y$, respectively, coefficients from register means 100 or 101 to provide the digital data inputs for the X and Y gradient DAC means 102 and 103 and provide, responsive thereto, the analog audio-frequency gradient signals at outputs 40-3a and 40-3b.

Figures 1, 2C:
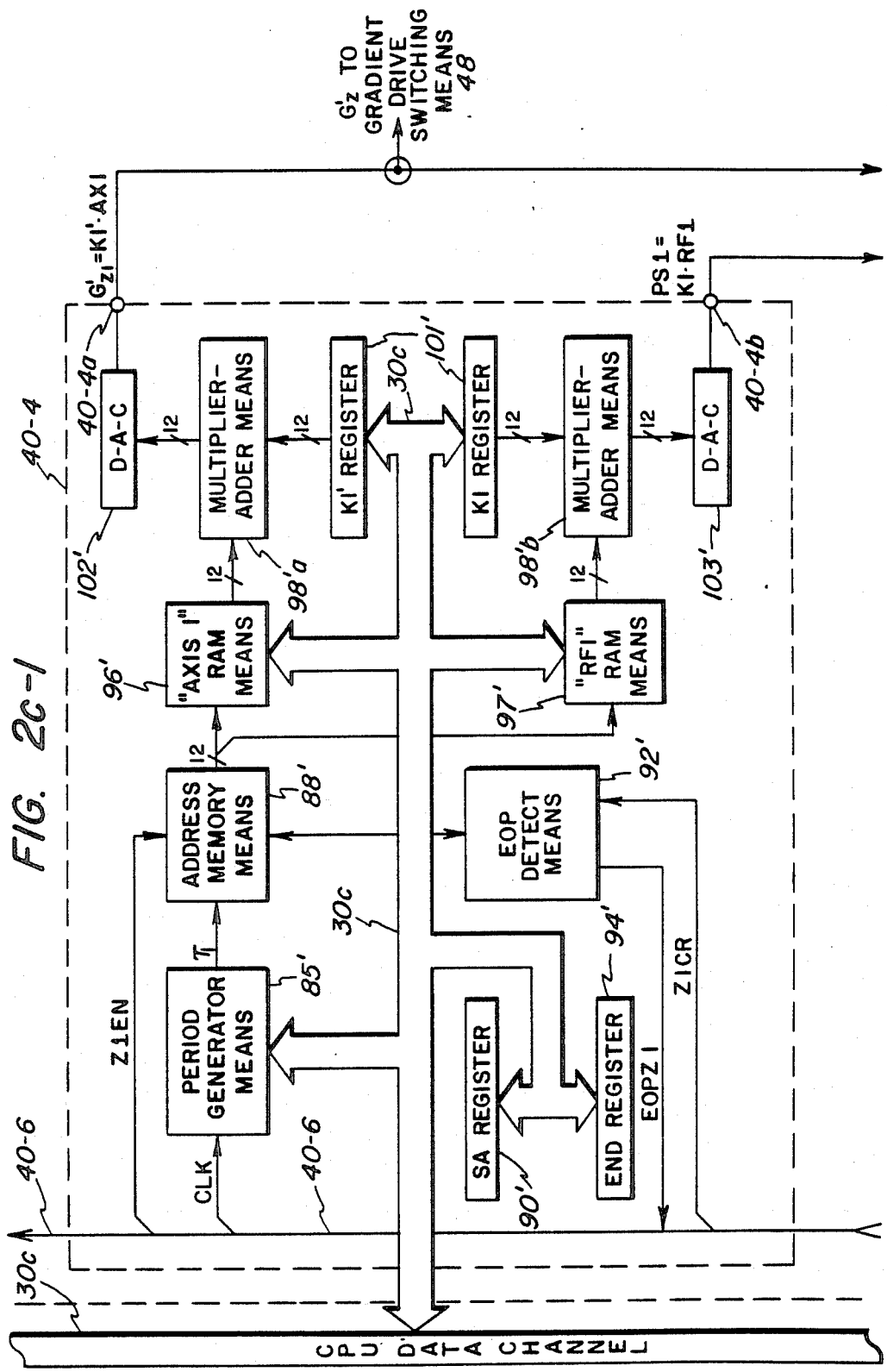
Figures 2, 2C:
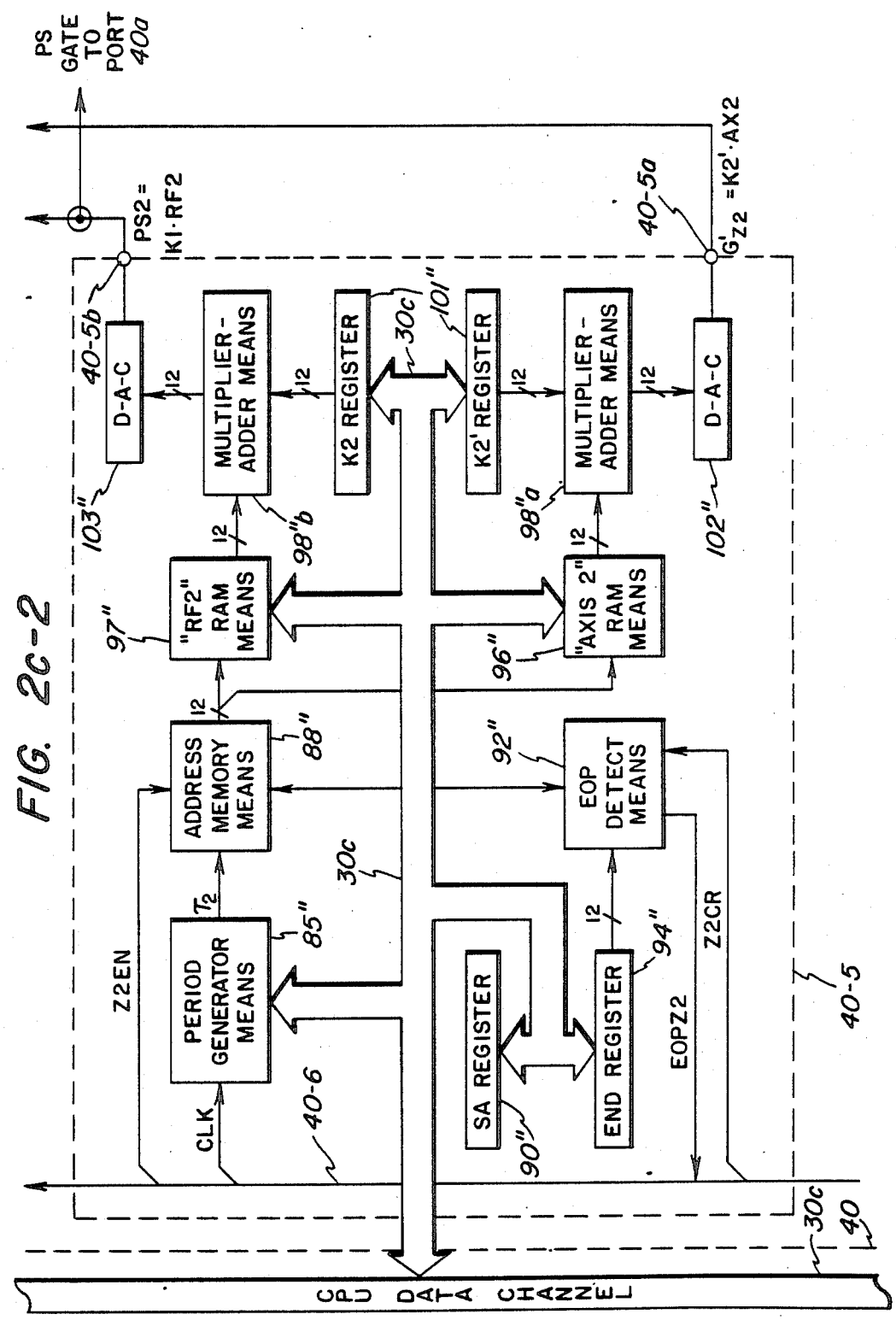

Referring now to FIGS. 2c-1 and 2c-2, a pair of second-type waveform-generator portion means 40-4 and 40-5 contain essentially the same means as contained in the first-type waveform-generator portion means 40-3. Portion means 40-4 and 40-5 generate a pair of audio-frequency analog signals and two different RF pulse-shape modulation functions. As will be seen in subsequent discussion, hereinbelow, of some of the presently preferred imaging/spectroscopy sequences, the X-gradient and Y-gradient signals generally require only a single signal, of the same waveshape, amplitude and time duration, in each repetition of a particular imaging sequence, whereby any X-gradient or Y-gradient signal waveform changes can be commanded from the computer means CPU data channel 30c, in a relatively short time after the EOP of a first sequence and immediately prior to the start of a second sequence. Conversely, the Z-gradient waveform typically requires two different amplitude/time duration waveforms (even if of the same waveshape during any one particular sequence) while the RF pulse-shaping modulation (PS) gate function is often required to generate a pair of waveforms having entirely different durations, waveforms and/or amplitudes, as, for example, in any single sequence requiring a selective 90° RF pulse, typically provided with a frequency-limiting modulation envelope (such as a Gaussian, sinc or other non-rectangular waveform) and also requiring a non-selective 180° RF pulse, having a rectangular PS modulation envelope and an entirely different amplitude and duration than the selective 90° non-rectangular RF pulse. For these reasons, two Z-gradient signal waveforms $G'_{Z1}$ and $G'_{Z2}$ are to be generated, in addition to first and second RF carrier pulse-shaping PS1 and PS2 modulation envelopes. It is somewhat arbitrary as to which of the two second-type waveform-generator portion means 40-4 and 40-5 generate which pair of the four signals; however, since only one pulse-shaping PS waveform signal is generally required at the same time as a Z-gradient signal waveform, it is advantageous to have one of the portion means, e.g. portion means 40-4, generate a first Z-gradient waveform and a first pulse-shaping signal waveform, while the other portion means, e.g. portion means 40-5, also generates a single Z-gradient signal waveform and a single pulse-shaping PS signal waveform. Since the Z-gradient and pulse-shaping waveforms are often enabled and disabled in sets, the above partitioning allows one of portion means 40-4 or 40-5 to be enabled at any one time, while the other portion means 40-5 or 40-4 is simultaneously disabled and being downloaded with new data from data channel 30c, for subsequent enablement at a future time (when the other one of the portion means is disabled and being newly downloaded with data for a next subsequent usage). In this manner, the varying Z-gradient and/or pulse-shaping functions can be rapidly modified during any particular NMR investigation sequence.

Each of portion means 40-4 and 40-5 has the period generator, address memory, start address register, EOP detect, end register, RAM, constant registers, multiplier-adder and analog-to-digital conversion means shown, and numbered with reference designations similar to those of portion means 40-3 (where means 40-4 has single-prime reference designations in FIG. 2c-1 and portion means 40-5 has double-prime reference designations in FIG. 2c-2). The sequence of operation, responsive to the CLK signal to generate individually programmable memory-updating time interval signals $\tau_1$ or $\tau_2$, and with enablement responsive respectively to one of a first Z enable (Z1EN) or a second Z enable (Z2EN) signal, with continuous-run capability responsive to the appropriate one of a first Z continuous-run (Z1CR) or a second z continuous-run (Z1CR) signal, and generation of first or second Z end-of-period signals EOPZ1 or EOPZ2, respectively, will be understood by referring to the discussion of operation of portion means 40-3 hereinabove. The respective first and second gradient "axis" signals $G'_{Z1}$ or $G'_{Z2}$, or the first and second pulse-shaping signals PS1 or PS2, can be switched responsive to computer means CPU signals and/or switching signals provided on the interface means internal data bus 40-6 from master sequencer portion 40-1. Only one axis-gradient $G'_Z$ signal and only one pulse-shaping PS gate signal is provided by the pair of portion means 40-4 and 40-5 at any particular instant.

THE RF SPECTROMETER SUBSYSTEM

In accordance with the invention, a presently preferred embodiment of our novel RF spectrometer subsystem includes RF transmitter means 26a, preamplifier means 22, receiver means 26b, common portion 26c and RF power amplifier means 20.

Figure 3:
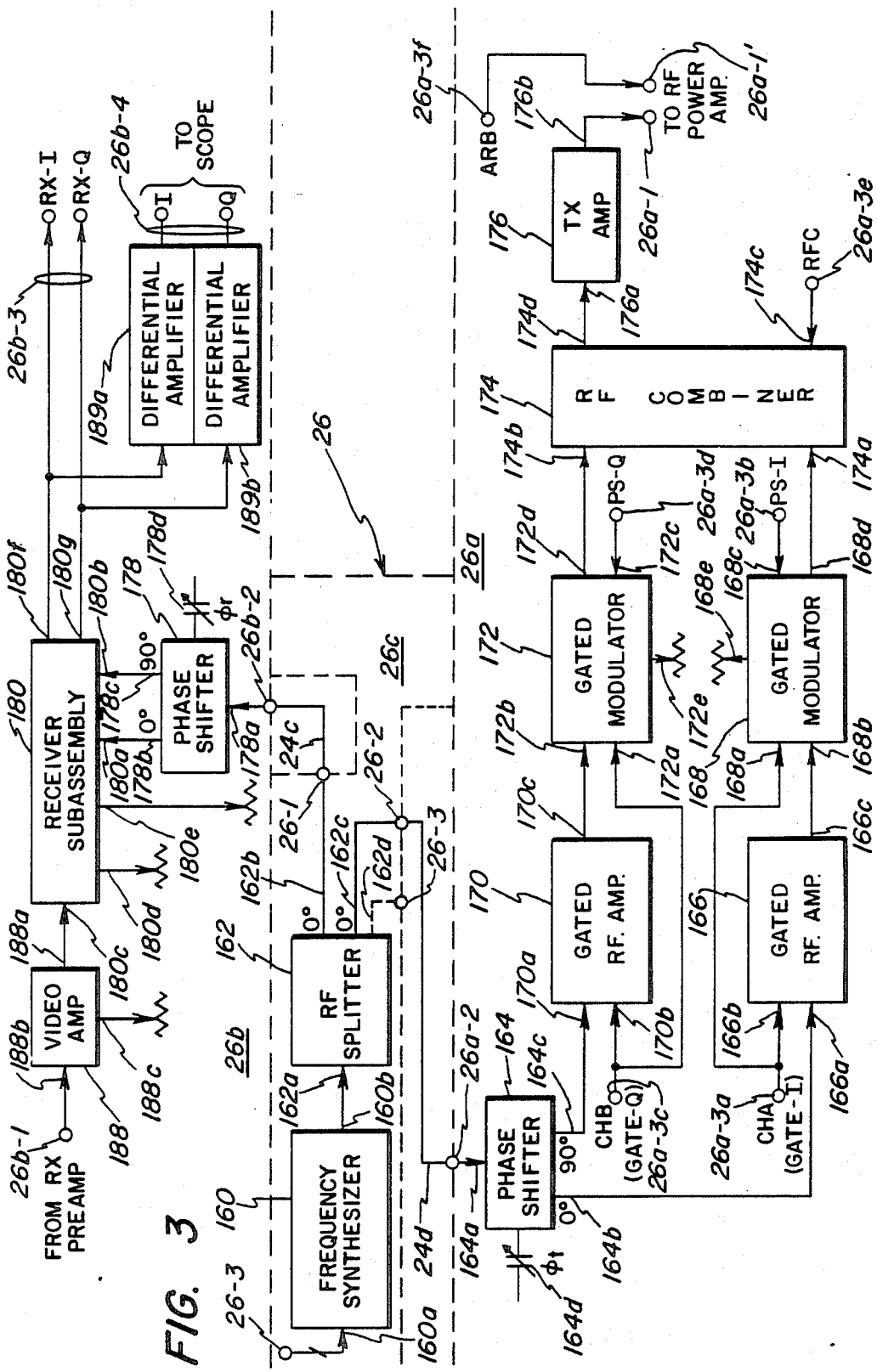
FIG. 3 is a schematic block diagram of one presently preferred embodiment of the novel NMR spectrometer subsystem of the present invention.

Referring to FIG. 3, common portion 26c includes a frequency synthesizer means 160, such as a PTS160 digitally-programmable frequency synthesizer and the like, having a frequency-control input port 160a for receiving digital information, from the spectrometer subsystem input 26-3, for establishing the exact frequency of the high-spectral-purity RF signal at the RF output 160b thereof. The substantially-constant-amplitude RF signal at output 160b is provided to the input 162a of an RF signal splitter means 162, having a pair of outputs 162b and 162c at which a pair of RF signals appear which are each a portion of the input signal having the same frequency thereof, but with lesser amplitude and substantially 0° phase shift, therebetween. First RF splitter means output 162b is connected to common portion output 26-1, and thence, via cable 24c, to the receiver means local oscillator input 26b-2. The second RF splitter means output 162c is connected to common portion output 26-2 and thence, via cable 24d, to transmitter means oscillator input 26a-2. A third output 162d may be provided, at output 26-3, for use with the power amplifier means (discussed hereinbelow with respect to FIG. 4').

Spectrometer transmitter means 26a receives the carrier signal at input 26a-2 for connection to the input 164a of a phase shifter means 164. Phase shifter first and second outputs 164b and 164c are in phase-quadrature with one another, i.e. the phase of the signal at output 164c is rotated 90° with respect to the phase of the signal at output 164b; a phase shift adjustment 164d is included to adjust the transmitter phase shift $\Phi_t$ of means 164 to be exactly 90° between outputs 164b and 164c. Phase shift means output 164b is connected to the RF input 166a of a first gated RF amplifier means 166, having a second input 166b receiving a channel A, or I-channel, gating CHA signal from the pulse-shape/gate input port 26a-3 on a first line 26a-3a; the CHA gate signal is also applied to a gating input 168a of an I-channel gated modulator means 168. The RF input 168b of the I-channel gated modulator means receives the gated RF signal from the first amplifier output 166c. A second gating input 168c of the first gated modulator means receives an I-channel pulse-shaping PS-I analog signal on another line 26a-3b from input port 26a-3. When an enabling logic level is present at the CHA input, the I-channel transmitter carrier is gated into the first gated modulator means, wherein the carrier amplitude is modulated with the desired pulse-shape waveform of the PS-I signal; the gated and modulated I carrier signal waveform appears at the gated modulator output 168d. Similarly, the quadrature Q-channel carrier at output 164c of the phase shifter means is applied to the RF input 170a of a second gated RF amplifier means 170, having a gate control input 170b receiving a channel B, or Q-channel, gating CHB signal on a third line 26a-3c from the pulse-shaping/gating input port 26a-3 of the transmitter means. The CHB gate signal is also applied to a first input 172a of a second gated modulator means 172, having an RF input 172b receiving the gated Q-channel output signal from output 170c of the second gated RF amplifier means. The second gated modulator means 172 also has a modulation inut 172c receiving the quadrature-channel pulse-shaping PS-Q analog signal on a fourth line 26a-3d from input port 26a-3. Responsive to a gate-enabling logic level of the Q-channel gate-enabling signal CHB, the RF carrier is gated into modulator means 172 and is amplitude-modulated therein by the Q-channel pulse-shaping waveform signal PS-Q. The gated and modulated quadrature carrier is provided at second gated modulator means output 172d. Each of gated modulator means 168 and 172 are typically of a double balanced modulator/mixer nature, whereby the amount of unbalanced-carrier fed through the gated-off modulator (responsive to a disabling logic level CHA or CHB signal at respective inputs 168a or 172a) can be minimized. We have found that having separately gated and modulated I-channel signals for providing "90° RF" signals, e.g. for use as 90° non-selective or selective pulse RF drive and the like, and separate gated and modulated Q-channel signals for providing "180° RF" signals, e.g. for use as selective or non-selective 180° RF drive and the like (with rectangular, Gaussian, sinc-function and the like envelope shapes), can provide all of the various RF drive signals required in all of the different pulse sequences presently used for NMR experimentation. It should be understood that new RF pulse envelope shapes may be added to our system by programming the system computer means 30 to download the appropriate envelope-shape-defining data into the appropriate PS memory means of the interface means 40; since each memory means can store up to 2048 different points, each with one of 2048 different levels, any particular PS envelope waveform can be easily provided.

The I-channel signal from the first gated modulator output 168d is applied to a first RF input 174a of a gated RF combiner means 174, while the Q-channel second gated modulator means output 172d signal is applied to a second RF input 174b. A radio-frequency combiner means gating (RFC) signal is provided at a gating input 174c, via a fifth line 26a-3e from the input port 26a-3. If the I-channel or Q-channel gated and modulated carrier is present at either one of inputs 174a or 174b, and the RFC signal is provided at an enabling logic level at input 174c, a gated-modulated-gated RF signal is provided at the RF combiner means output 174d, for introduction to the input 176a of a linear transmitter TX amplifier means 176, at the output 176b of which is provided the transmitter output 26a-1 signal to the RF power amplifier means input 20b. By use of gating in the first RF amplifier means 166 or 170, in the modulating means 168 or 172 and in the RF combiner means 174, greater than 50 dB. of carrier suppression can typically be provided between a pair of successive RF signal pulses, regardless of whether the pair of successive pulses are 90° pulses from the I-channel, 180° pulses from the Q-channel or alternate 90°/180° pulses from alternating ones of the I- and Q-channels. The RF amplifier blanking gate ARB signal is provided at transmitter means output 26a-1', via a sixth line 26a-3f from the pulse-shaping/gating signal input port 26a-3.

Figure 3A:
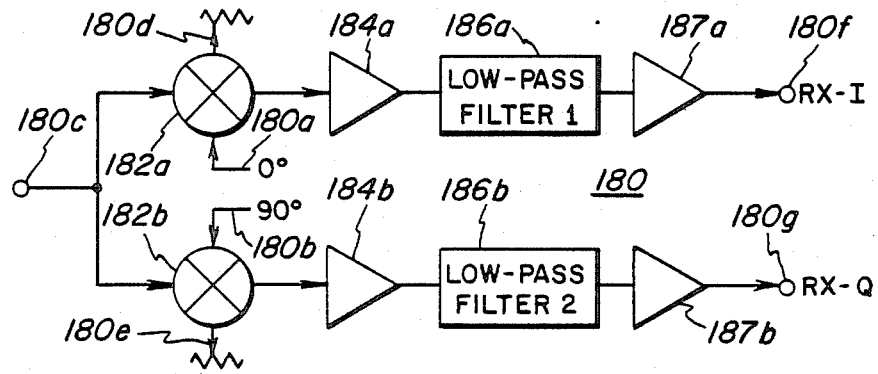
FIGS. 3a and 3b are schematic block diagrams of one presently preferred embodiment of, respectively, a receiver subassembly and a transmit/receive switching means for allowing use of a single radio-frequency antenna means in a high-field NMR system.

In the receiver, the carrier signal at input 26b-2 is provided to the input 178a of a second phase shifter means 178. This phase shifter means provides a pair of "local-oscillator" signals at outputs 178b and 178c, in phase-quadrature with one another; the phase shift therebetween is adjustable by means of a $\Phi_r$ adjustment 178d. One of the phase-quadrature "local-oscillator" (LO) signals is provided to each associated one of first and second LO inputs 180a and 180b, respectively, of a receiver subassembly means 180. Within receiver subassembly means 180 (as more specifically shown in FIG. 3a) are a pair of double-balanced demodulator means 182a and 182b, respectively receiving the 0° local-oscillator signal from input 180a or the 90° (quadrature) local-oscillator signal from input 180b at a first input. Both demodulator means receive the input signal from a receiver subassembly means input 180c. Associated with each demodulator means is a balance control 180d or 180e, respectively, for nulling the amount of local-oscillator signal feedthrough of each demodulator. After dividing the input power into this pair of channels (denoted the I-channel and the quadrature Q-channels), the quadrature signals are demodulated against the quadrature LO signals and the resulting audiofrequency output signals (which are thereby phase-sensitively detected in quadrature) are amplified in respective amplifier means 184a and 184b. The amplified I- and Q-channel baseband signals are low-pass filtered in respective low-pass filtering means 186a or 186b and are then further amplified in respective amplifier means 187a and 187b, to provide the received I-channel (RX-I) output 180f signal or the received Q-channel (RX-Q) ouput 180g signal. The bandwidth (in Hertz) of low-pass filters 186 is set substantially equal to the number of points sampled per acquisition, divided by twice the duration (in seconds) of the acquisition period. The receiver subassembly input 180c receives the amplified signal at the output 188a of a video amplifier means 188, having an input 188b receiving the preamplified signal at receiver means input 26b-1. The reception antenna 16b provides the NMR response signal to the input 22a of the preamplifier means. Preamplifier means 22 typically has a noise figure on the order of about 1 dB. and a gain of about 45 dB. to about 55 dB.; the gain of video amplifier means 188 can be adjusted by a gain-adjustment control 188c to provide such additional gain, e.g. about 20 dB., as required.

The preamplifier output 22b signal is provided to input 180c. It will be seen that the I-channel output 180f signal can be further amplified in a first differential amplifier means 189a, while the Q-channel quadrature output 180g signal can be further amplified in a second differential amplifier means 189b, to provide a pair of I and Q signals at another output port 26b-4 (shown in FIG. 3 and not shown in the system diagram of FIG. 1 for reasons of simplicity), to an oscilloscope or the like indicating device, to assist in the alignment and set-up of the various spectrometer portions. It should be understood that if reception antenna means 16b (see FIG. 1)

comprises a set of orthogonally-positioned reception coils, the received NMR signals from the orthogonal antennae can be separately preamplified and each of the two orthogonal received signals can be themselves quadrature-detected to yield a total of four separate channel signals, i.e. a first antenna pair of phase-quadrature signals $I_1$ and $Q_1$, and a second orthogonal antenna pair of phase-quadrature signals $I_2$ and $Q_2$. The four channel signals will then be power-combined into two channels, the I'-channel and the Q'-channel, using the relationships: $I'=I_1+Q_2$; and $Q'=Q_1+I_2$, to obtain a further $\sqrt{2}$ improvement in signal-to-noise ratio. The I' and Q' signals then replace the I and Q signals at receiver means output port 26b-3, for introduction into the interface means digitizer portion means 40-2, discussed hereinabove.

Figure 3B:
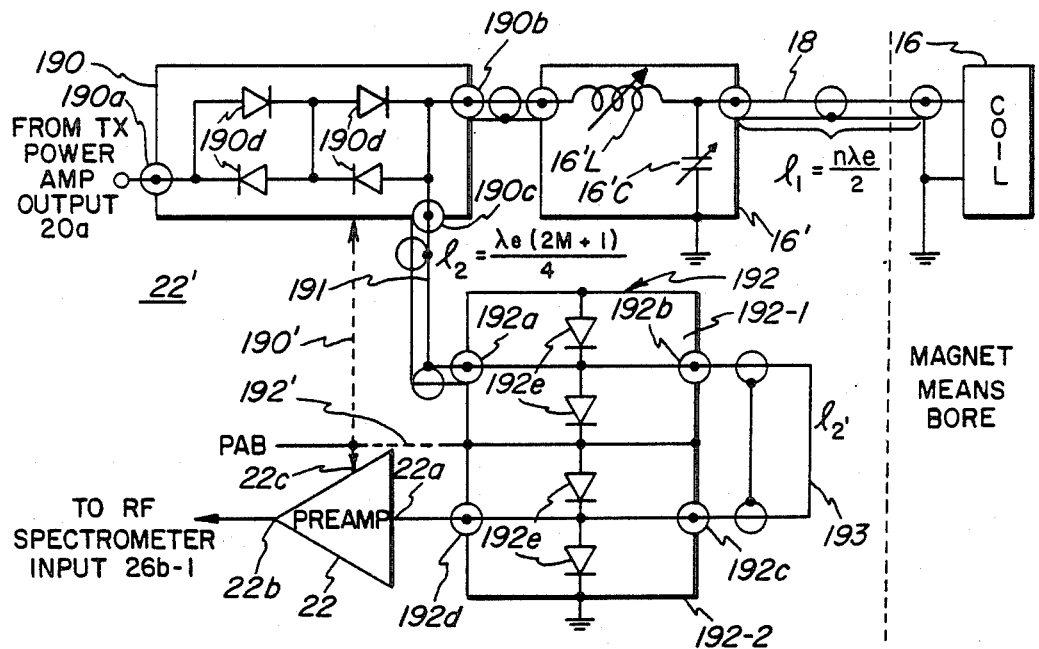

Referring now to FIG. 3b, while separate excitation and reception antennae 16a and 16b are shown in FIG. 1, it should be understood that a single antenna means 16, such as a solenoidal coil and the like, can be utilized for both excitation and reception functions. The single coil 16, located within the magnet means bore (or, more specifically, within the gradient coil means bore 12a), as well as separate antennae 16a and 16b, can be utilized with an impedance-matching means 16', comprised of substantially lossless reactive elements, such as variable inductances 16'L and variable capacitances 16'C, to match the actual impedance of antenna 16 to a standard cable impedance, e.g. 50 ohms. Advantageously, the single cable 18, between the antenna 16 (located within the magnet means or gradient coil means bore) and the impedance-matching network means 16' located external to the bore (or the cables 18a and 18b of FIG. 1), has a length $l_1$ which is not only long enough to extend from the at least one antenna means 16 within the bore to the network means 16' (or to the preamplifier means 22 and from power amplifier means 20), but is also an integer multiple of one-half the effective wavelength of electromagnetic radiation in the particular cable utilized, at the Larmor frequency (e.g. about 63 MHz. for $^1$H imaging in a static magnetic field of about 1.5 T). The integer number n of the effective cable half-wavelengths causes the antenna 16 impedance to appear to be directly at the output of any impedance-matching means 16' utilized, or, alternatively, directly at the power amplifier means output. In addition to the protective effect of the power-amplifier-enabled blanking PAB signal provided to preamplifier means blanking input 22c, additional protection from the high-power RF excitation pulses can be obtained through the use of RF gating means 190 and 192, located between the transmission power amplifier output 20a, the received preamplifier input 22a and the RF antenna means 16. This additional isolation protection is especially advantageous in the case where a single antenna means 16 is used for both excitation and reception. The additional "isolation" means 190 and 192 can either be actively-gated means, responsive to the PAB signal (as shown by the broken PAB input lines 190' and 192'), or can be passive isolation means as shown. A first passive isolation means 190 has an input 190a receiving the high-power RF excitation pulse from the transmitter power amplifier output 20a. The passive isolation means output 190b is connected to the antenna 16, through any intermediate impedance-matching means 16' and cable 18. The common antenna port 190b is also directly connected to the reception output port 190c, and is connected through a plurality of gating elements 190d, such as anti-parallel-connected RF switching diodes and the like, to power amplifier input 190a. The receiver output port 190c is connected to the input port 192a of the second passive isolation means 192 through a cable 191 having a length $l_2$ equal to an odd multiple of an effective quarter-wavelength of the particular cable utilized. Thus, $l_2=\lambda_e(2M+1)/4$, where M is a non-negative integer and $\lambda_e$ is the effective wavelength, at the average Larmor frequency, of the particular cable utilized. The output 192b of a first portion 192-1 of the second isolation means is connected through another cable 193, having a length $l_2'$ (another odd quarter-wavelength multiple of the effective cable wavelength at the average Larmor frequency used) to the input 192c of a second isolation means second portion 192-2. The second isolation portion output 192d is connected to the reception preamplifier input 22a. Each of second isolation means first and second portions 192-1 and 192-2 respectively contain a plurality of shunt elements 192e, such as anti-parallel-connected RF switching diodes, connected between the active conductor of the isolation means portion and RF ground potential. In the absence of a high-power RF pulse from power amplifier means output 20a, first isolation means series diodes 190d provide an open-circuit condition between input port 190a and ports 190b and 190c. Port 190b is directly connected to port 190c, so that any reception signal at antenna means 16 is provided in substantially unattenuated manner at second isolation means input 192a. The second isolation means diodes 192e are in the open-circuit condition, whereby the reception signal at input 192a appears at output 192d and preamplifier input 22a, as required. Conversely, during the presence of a high-power RF excitation pulse at input port 190a, diodes 190d conduct to the substantially short-circuit condition, connecting port 190a to port 190b, whereby the excitation signal is provided to the impedance-matched antenna means in substantially unattenuated manner. The full power of the excitation signal also, unfortunately, appears at first isolation means output port 190c; however, the signal level effectively causes diodes 192e to conduct, whereby short-circuits are provided at second isolation means ports 192a, 192b and 192c. The short-circuit condition at port 192c is reflected back along cable 193 to appear (because of the odd-multiple-quarter-wavelength) as a substantially open circuit at port 192b. The resulting short-circuit condition at port 192a is reflected back along cable 191 to appear at port 190c as a substantially open-circuit condition. Accordingly, the vast majority of excitation power flows out of first isolation means port 190b, with only a few watts (i.e. the power amplifier means RF output power reduced by the first isolation means 190 actual isolation of about 30 dB.) to port 190c. This attenuated power is further reduced by the attenuation through the second attenuation means first portion 192-1 and then through the second portion 192-2. As each portion of second isolation means 192 can easily achieve an isolation attenuation of at least 20 dB., the power amplifier means output power level of between about 60 dBm. and about 70 dBm. is attenuated by at least 70 dB., such that the residual power level applied to the blanked preamplifier input 22a is on the order of 1 milliwatt (a level easily tolerated by low-noise receiving preamplifiers utilizing GaAs FET devices or even silicon FET or bipolar devices). In this manner, rapid passive switching of a single antenna means 16 between excitation and receive functions, responsive to the high-power excitation RF signal, is provided.

Figure 4:
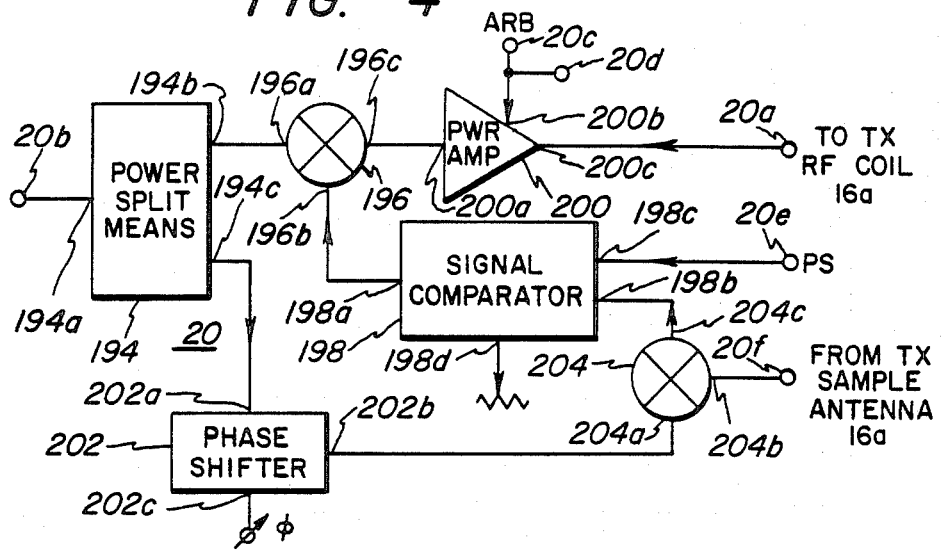
FIGS. 4 and 4' are schematic block diagrams of linearizer means respectively receiving first signal amplitude information from the system interface means or from the first signal itself.
Figure 4:
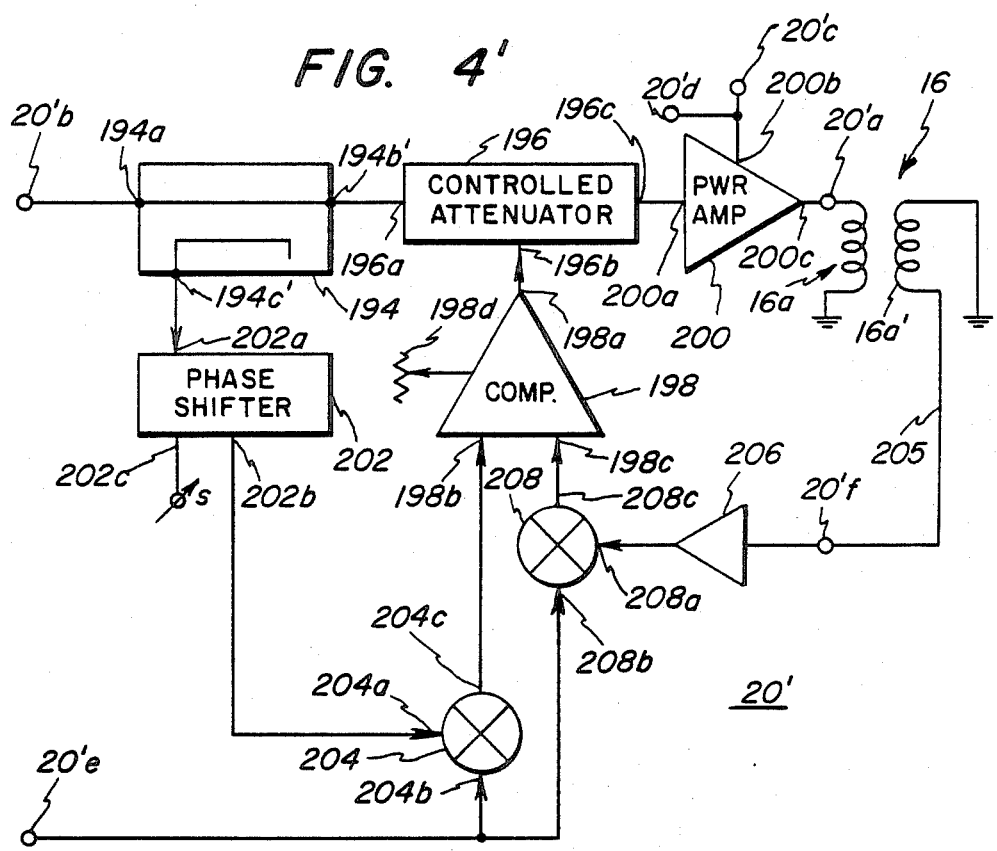

Referring now to FIG. 4 or 4', whether one common antenna or several antennae are used, the RF power amplifier means 20 must provide a high-power excitation signal at its output 20a or 20'a, and that signal must be a highly-linearly-amplified version of the first signal applied to RF amplifier means input 20b or 20'b. The amplifier-enabling ARB gating signal, at an input 20c or 20'c, for one particular 5 kilowatt broadband, high gain amplifier (model 2000LM8, from Amplifier Research Inc.) used, is required to commence some time prior to, and be present during, each of the RF pulses provided at RF power amplifier means signal input 20b, to enable the amplifier for high power operation and to simultaneously generate a receiving RX preamplifier means blanking signal at output 20d or 20'd, when such blanking signal is needed. While not shown in FIG. 1, for reasons of simplicity, one presently preferred power amplifier means 20 (FIG. 4) embodiment also receives the pulse-shaping PS signal at another input 20e, from transmitter means 26a. In embodiment 20' (FIG. 4'), input 20'e receives the Larmor center frequency CW signal from the frequency synthesizer output 26-3 of FIG. 3. In either embodiment, the excitation antenna means 16a advantageously contains a transmitter TX sampler antenna subsection 16a' (FIG. 4') which provides, via a cable 205, a transmitter sample signal to an auxiliary input 20f or 20'f of the power amplifier means.

The gated and modulated RF carrier excitation signal at input 20b or 20'b is applied to the input 194a of a power splitter means 194. The power splitter may provide substantially equal power division between its plurality of outputs e.g. outputs 194b and 194c (FIG. 4), or may provide a reduced power ratio to one output 194c', with respect to another output 194b' (FIG. 4'), as required. The first power splitter means output 194b or 194b' is applied to an RF input 196a of a controlled attenuator means 196. Controlled attenuator means 196 may be a double-balanced mixer, operated in its controlled attenuator mode, or the like, whereby the internal attenuation thereof is responsive to the magnitude of a DC current at a control input 196b for establishing the magnitude of RF attenuation between an input 196a and an output 196c. The control current at input 196b is provided at the output 198a of a pulse comparator 198. The variable RF signal at attenuator means output 196c is applied to the input 200a of the main RF power amplifier 200. The ARB gating signal from input 20c or 20'c is applied to the blanking gate input 200b of the power amplifier. Responsive to the magnitude of the excitation signal at input 200a, only during the presence of the ARB signal, a linearly-amplified carrier signal is provided at power amplifier output 200c for connection to the power amplifier means output 20a or 20'a, and thence to the excitation antenna 16a within the magnet means bore. Because such factors as the thickness of the sample slice are controlled by the pulse-shaping PS modulation waveform characteristics, it is extremely important that the RF excitation magnetic field actually produced by excitation antenna 16a have essentially the modulation envelope established by the PS modulation waveform. Therefore, either the actual pulse-shaping modulation PS signal waveform is introduced at input 20e of embodiment 20, or is derived from the first signal, at input 20'b, by frequency conversion to a selected intermediate frequency, at comparator input 198b, by heterodyning the phase-shifted first signal sample at a first input 204a of a first mixer means 204. The synthesized center frequency signal, from input 20'e, is coupled to second input 204b, and the resulting output, at terminal 204c, is coupled to comparator input 198b. The amplified/buffered antenna sample signal, at the output of amplifier 206, is coupled to the first input 208a of a second mixer means 208, receiving the synthesized signal, from input 20'e, at its second input 208b. The second mixer means output 208c provides another intermediate-frequency signal, to comparator input 198c, with an amplitude responsive to the first signal amplitude at input 208b. This input 198c signal is compared to the input 198b signal (itself derived from the first signal input to the RF amplifier means). This first signal is sampled at the second power splitter means output 194c or 194c'. This excitation signal sample is introduced to the input 202a of a phase shifter means 202. The phase-shifted excitation sample signal appears at the phase shifter means output 202b with an amount of phase shift $\Phi_s$ established responsive to the setting of a phase shift control 202c. The phase-shifted excitation sample (or first) signal, as introduced into first mixer means input 204a, is used so than signal comparator means 198 develops, responsive to the difference between the desired PS and actual envelope video signals, a signal at its output 198a for correction of the attenuation of attenuator means 196. Thus, by use of attenuator means 196, signal comparator means 198, phase shifter means 202 and mixer means 204/208, automatic amplitude-level-correction of the excitation RF field magnitude is achieved. Advantageously, signal comparator means 198 includes a control 198d for setting the magnitude of the signal at signal comparator output 198a to some average level, to cause attenuator means 196a to have some resting attenuation value $\alpha_r$ greater than the minimum attenuation and less then the maximum attenuation thereof, such that attenuation means 196 can be controlled to both lesser and greater attenuation values, relative to the $\alpha_r$ resting value, to control the linear amplification gain in both increasing and decreasing directions. The additional resting attenuation $\alpha_r$ of the attenuator means 196 is compensated for by either increasing the amplification factor of power amplifier 200 (which may cause undesired instability or non-linearity therein) or, more advantageously, by a coordinated increase in the gain of TX amplifier means 176, to increase the absolute signal level at power splitter means first output 194b.

Figures 1, 4A:
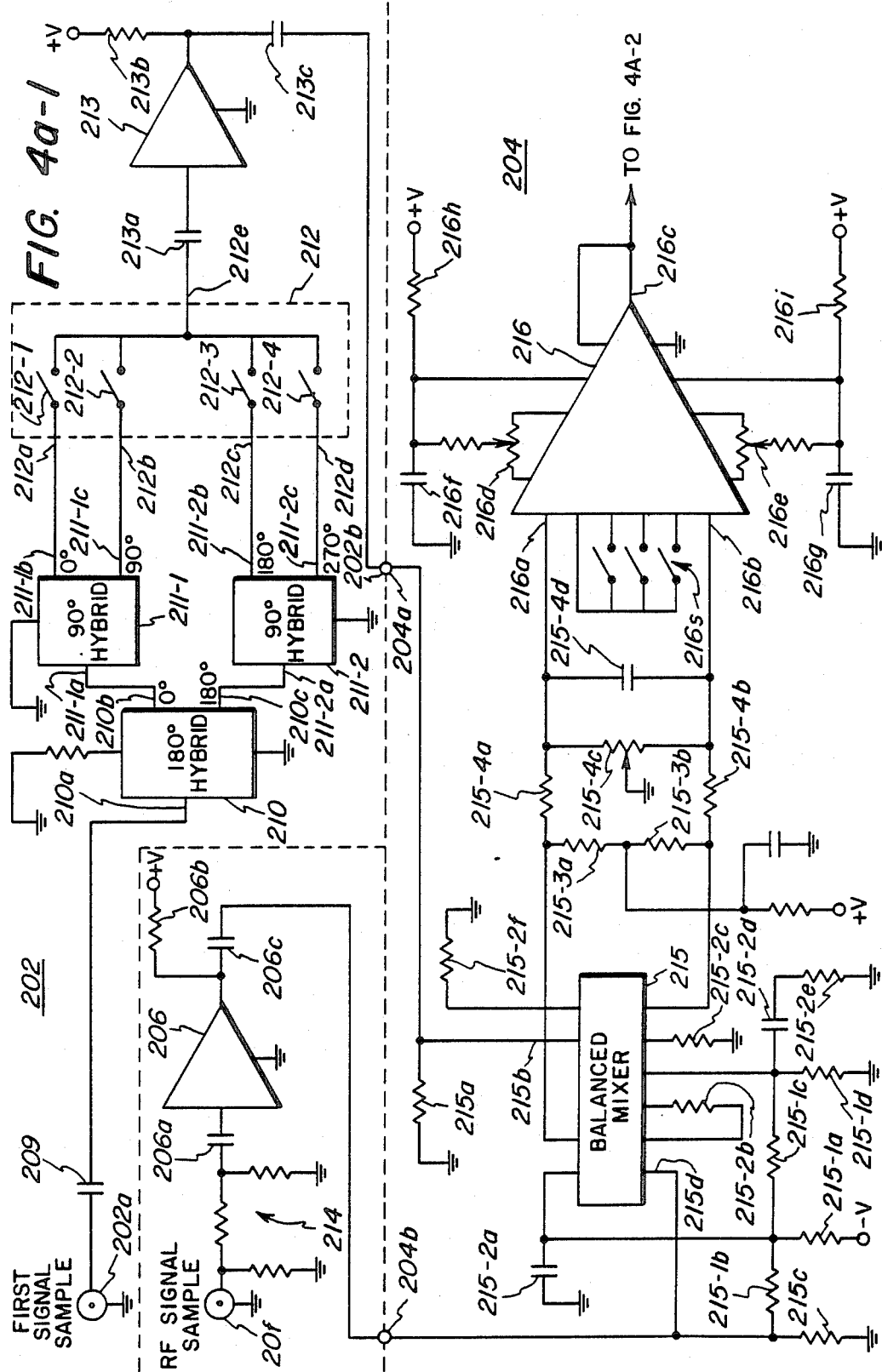
Figures 2, 4A:
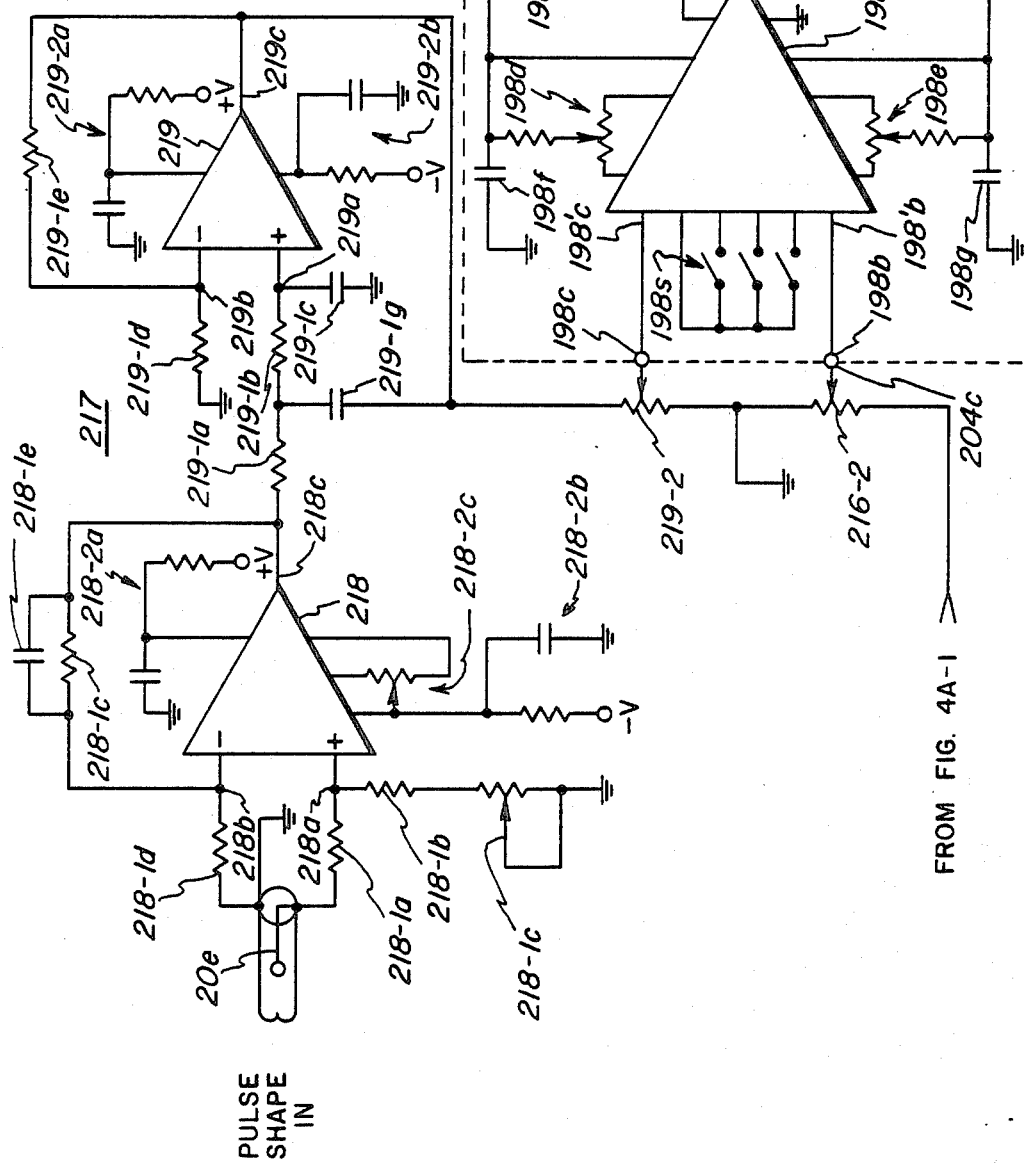

Combined FIGS. 4a-1 and 4a-2 show one presently preferred circuit for realizing a linearizer for use with a power splitting means 194, a control attenuator means 196 and a power amplifier means 200. A sample of the first, or amplifier input, signal is applied to phase-shifter means input 202a. This signal is coupled through a series capacitance 209 to the input 210a of a 180° hybrid means 210. The pair of hybrid means outputs 210b and 210c provide signals of substantially the same amplitude, but 180° out-of-phase. The 0°-phased signal at output 210b is applied to the input 211-1a of a first 90° hybrid means 211-1, while the 180°-phased signal at output 210c is applied to the input 211-2a of a second 90° hybrid means 211-2. The outputs 211-1b and 211-1c respectively provides signals which are 0°-shifted and 90°-shifted, with respect to the phase of the signal at input 210a. The 0° and 90° signals are respectively coupled to the first and second switching portions 212-1 and 212-2 of a one-pole, four-throw switch means 212. The outputs 211-2b and 211-2c of the second 90° hybrid means provide signals which are 180°-shifted and 270°-shifted, respectively, with respect to the phase of the signal at input 210a. The 180° and 270° signals are respectively coupled to third and fourth switch portions 212-3 and 212-4. It should be understood that other combination of phases can be equally as well obtained, and that even the 0°-90°-180°-270° combination can be obtained by other means, e.g. a 90° hybrid for means 210 and a pair of 180° hybrids for means 211-1 and 211-2. By means of a control portion (not shown), only one of switch portions 212-1 through 212-4 is closed at any one time, to provide a signal, phase shifted into a selected quadrant, at switching means output 212e. This signal is coupled via a coupling capacitance 213a to the input of a unit amplifier 213. After amplification, the phase-shifted signal appears across a load resistance 213b and is coupled through a DC isolation capacitance 213c to appear at the phase-shifter output 202b, for coupling to mixer input 204a.

Sample antenna 16a' provides the RF sample signal at input connector 20f. The sample signal is attenuated by attenuation means 214, to provide some degree of isolation, and is then connected, via input capacitance 206a, to the input of another unit amplifier 206. The amplified sampled signal appears across load resistance 206b and is coupled, via a DC isolation capacitance 206c, to the mixer means second input 204b. Mixer means 204 includes a balanced mixer integrated circuit 215 and an amplifier integrated circuit 216. The phase-shifted first signal at input 204a appears across a termination resistance 215a and is coupled to a first input 215b of the balanced mixer integrated circuit. The buffered sample signal at input 240b appears across a termination resistance 215c at a second input 215d of the integrated circuit. Additional components may be required by the particular mixer used; such additional components may include: DC biasing components 215-1b through 215-1d; operational components such as components 215-2a through 215-2f; and output components, such as output load resistances 215-3a and 215-3b, attenuation series resistances 215-4a and 215-4b, balance potentiometer 215-4c and capacitor 215-4d, and the like, all as required to provide a properly heterodyned video signal at inputs 216a and 216b of amplifier means 216. Dependent upon the difference of the signals at inputs 216a and 216b, the magnitude of the amplifier output 216c signal will be established, for connection to one input 198b of the pulse-shape comparator. Amplifier 216 operates in conjunction with input and output balance potentiometers 216d and 216e, and DC bias components 216f-216i, in manner well known to the art. The recovered baseband video PS pulse signal appears across first comparator input-setting potentiometer 216-2 (FIG. 4a-2).

The pulse-shape signal at input 20e is applied to an additional low-pass filter means 217, serving to somewhat isolate input 20e from the second comparator gain-setting potentiometer 219-2. Low-pass filter means 217 utilizes two operational amplifiers 218 and 219. The non-inverting input 218a of the first amplifier is connected through a first input resistance 218-1a to the signal terminal of input 20e. Non-inverting input 218a is also connected through a fixed resistance 218-1b and a variable potentiometer 218-1c (used to set gain and common mode rejection) to circuit ground potential. The inverting input 218b of the operational amplifier is connected to ground potential through a first resistance 218-1d and is connected through both a feedback resistance 218-1c and a compensation capacitance 218-1e to the first operational amplifier output 218c. Bias decoupling networks 218-2a and 218-2b are utilized, as is a balance control means 218-2c, as known to the filter arts. The low-pass active filter integrated circuit 219 has its non-inverting input 219a connected to the first operational amplifier output 218c through first and second series filter resistances 219-1a and 219-1b. A first filter capacitance 219-1c shunts input 219a. Inverting input 219b is connected to ground potential through a first gain-setting resistance 219-1d and is connected to filter amplifier output 219c through a feedback gain-setting resistance 219-1e. A second filter capacitance 219-1g is connected to the node between resistances 219-1a and 219-1b, and output 219c. Positive and negative supply decoupling networks 219-2a and 219-2b are utilized. The low-pass-filtered input signal pulse-shape waveform appears across potentiometer 219-2, for selection of the appropriate magnitude thereof for introduction into the second pulse comparator input 198c. The gain of the comparator is switch-selectable by means of switches 198S, in the same manner as for the corresponding gain selection switches 216 of the mixer. Input and output offset adjustment networks 198d and 198e are provided, as are DC bias and filtering components 198f–198i. The pulse-shape signal is thus compared against the video signal pulse-shape envelope provided by down-conversion of the actual sampled and radio-frequency magnetic field in the imaging magnet bore, and the difference therebetween is utilized to adjust, on a substantially instantaneous basis, the RF attenuation prior to the high-power amplifier means 200 to minimize distortion of the RF imaging magnetic field.

Figure 4B:
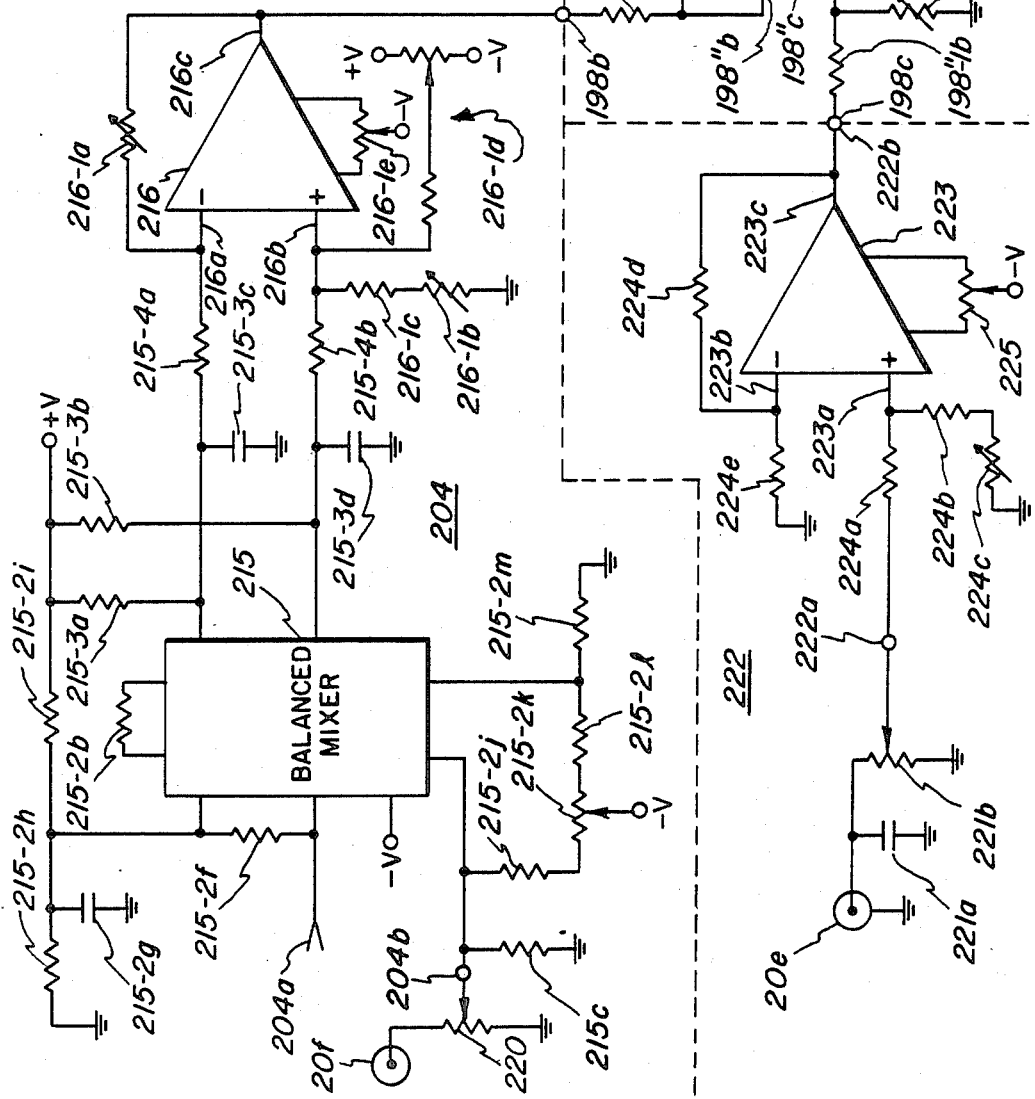
FIG. 4b is a schematic diagram of another presently preferred embodiment of a linearizer, for use with non-single-sideband carrier signals.

Referring now to FIG. 4b, the actual pulse-shape PS signal can be obtained from the interface means and provided to the pulse-shape signal input 20e, if a single sideband RF signal is not utilized as the excitation signal and overall system pulse shape fidelity is required (e.g. where even the minimal distortion of the RF signal pulse shape provided by the gated modulators and the like in the spectrometer transmission exciter portion cannot be tolerated). The sampled actual RF magnetic field signal is provided to input 20f and appears across a potentiometer 220, having the variable arm thereof adjusted to provide the desired magnitude of sensed RF signal across the terminating resistance 215c at mixer input 204b. The sampled first signal is applied to mixer input 204a, as in the previous embodiment. Balanced mixer integrated circuit 215 is again utilized with a gain-setting resistance 215-2b and various bias and bypass components 215-2f through 215-2m. The balanced mixer video outputs appear across the pair of output load resistances 215-3a and 215-3b and are applied through series resistances 215-4a and 215-4b to first and second inputs 216a and 216b of a buffer amplifier integrated circuit 216; RF carrier signal components leaking through to the output are substantially bypassed to common potential by capacitances 215-3c and 215-3d. The gain of buffer-amplifier 216 is established by a feedback gain resistance 216-1a, while the amplifier is balanced by a variable resistance 216-1b in series with a fixed resistance 216-1c, between common potential and input 216b. The input offset of buffer amplifier 216 can be established by bias network 216-1d, while the offset of output 216c can be zeroed with offset network 216-1e. Thus, a buffered video signal, provided at a first input 198b of the pulse comparator, is responsive to the pulse shape of the actual RF magnetic field in the imaging magnet bore.

The second pulse comparator input 198c receives the pulse shape PS waveform from input connector 20e. Because the actual PS signal from the interface means is to be utilized at input 222a, the buffering action of a buffer-amplifier means 222 is desirable. A high-frequency roll off capacitance 221a is provided to shunt high-frequency noise components to common potential. The incoming PS signal level can be attenuated, in level-setting potentiometer 221b, to provide the desired signal level at buffer input 222a. This input is connected through a first input resistance 224a to a first input 223a of a differential operational amplifier integrated circuit 223. Input 223a is also connected through a fixed resistance 224b in a balance variable resistance 224c, to circuit common potential. The second differential input 223b is connected through a feedback resistance 224d to the operational amplifier output 223c, and also connected through a resistance 224e to common potential. The static offset voltage can be minimized by means of a nulling network 225, while rheostat 224c can be adjusted to balance the buffer gain at essentially one, and thus maximize the common mode rejection of the buffer-amplifier means 223. Therefore, a pulse shape PS signal at output 222b is applied to comparator input 198c, without the high frequency or common mode extraneous signals which may otherwise obtain.

A comparator integrated circuit 198" is utilized in the pulse comparator 198. A first I.C. input 198"b is connected through a first input resistance 198"-1a to first input 198b, while a second I.C. input 198"c is connected through a second input resistance 198"-1b to the second comparator means input 198c. A balance variable resistance 198"-1c is connected from non-inverting input 198"c to circuit common potential; a variable comparator gain resistance 198"-1d is connected from inverting input 198"b to comparator output 198"a. A network 198"-1e can be provided for nulling the comparator means output 198a for equal signal values at inputs 198b and 198c. When all of the gains, offsets and balances have been properly adjusted, any difference between the analog pulse shape PS signal provided at input 20e and the detected pulse shape signal, obtained by heterodyning the first RF carrier signal (at input 204a) with the actually sensed RF pulse signal (at input 20f), can be used to control the attenuation of attenuator means 196 and thus to minimize overall amplitude distortion of the RF magnetic field to the imaging magnet bore.

Figure 4C:
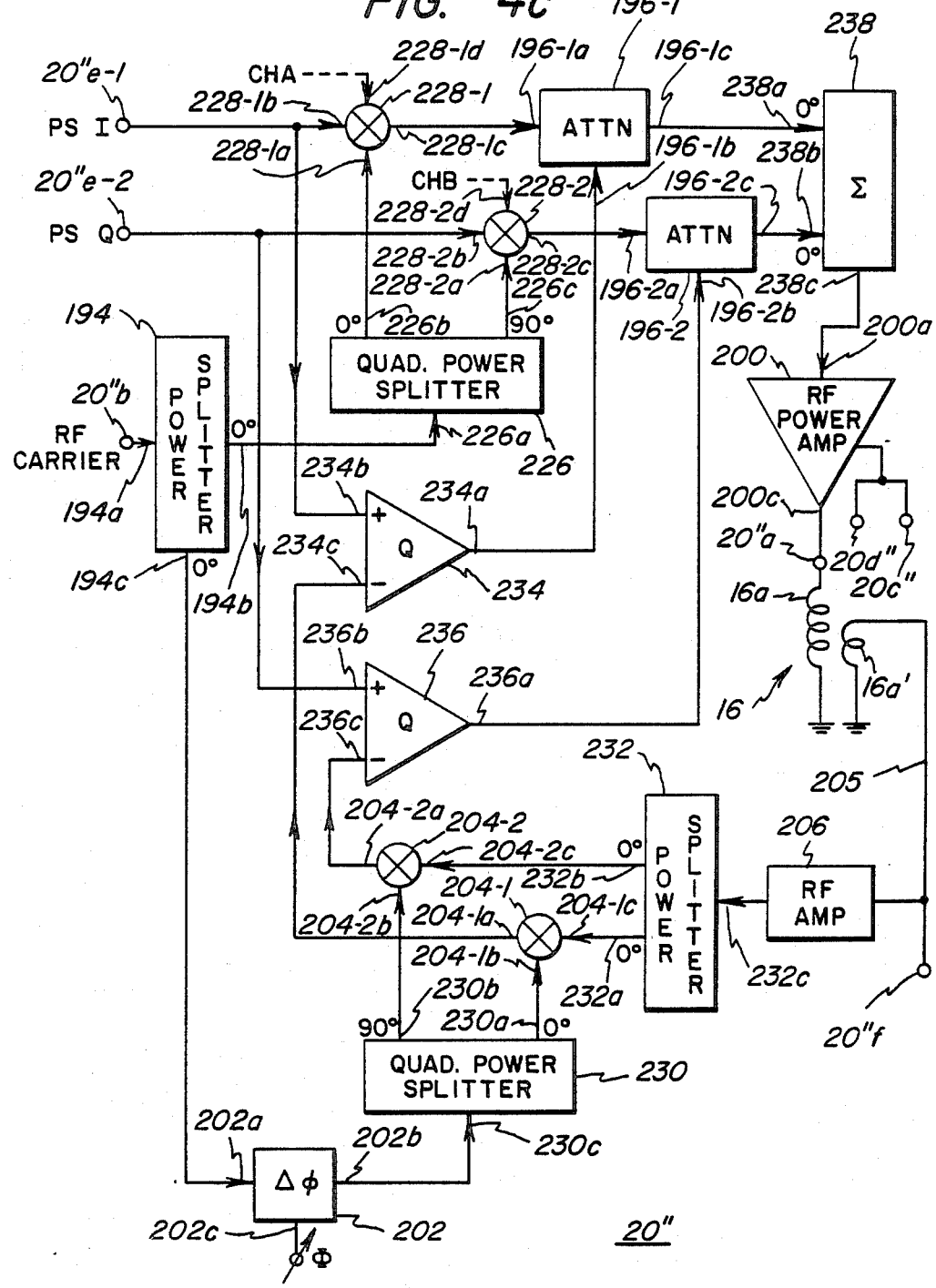
FIG. 4c is a schematic diagram of yet another presently preferred embodiment of a linearizer, for use with single-sideband carrier signals.

Referring now to FIG. 4c, an RF power amplifier means 20", suitable for minimizing RF magnetic field distortion for all forms of signal modulation, including single sideband modulation, compares the actual RF magnetic field excitation signal envelope shape with the pulse signal PS envelope shape generated in the interface means, is illustrated. This general-purpose linearized power amplifier means 20" provides high-power pulse signals at its output 20"a to the excitation coil 16a of RF antenna means 16. The excitation signal is provided responsive to receipt of: the proper RF carrier signal at first signal input 20"b; the proper gating pulse ARB signal at input 20c" (which also may provide the receiver preamplifier blanking PAB pulse at output 20d"); a pair of pulse-shape signals at the pair of pulse envelope inputs 20"e-1 and 20"e-2; and a sample signal, from sample coil 16a' via cable 205, to RF sample input 20"f. As in power amplifier means 20 (FIG. 4), the RF carrier first signal is applied to the input 194a of a power amplifier 194, providing a pair of in-phase, substantially equal-amplitude signals at each of outputs 194b and 194c. The signal at first output 194b is now provided to the input 226a of a first quadrature power splitter 226. The two outputs 226b and 226c of splitter means 226 provide substantially-equal amplitude signals which are in phase-quadrature with one another, such that the signal at output 226b is substantially at a phase of 0° with respect to the phase of the signal at splitter input 226a, while the signal at output 226c is substantially at a phase of 90° with respect to the phase of the signal at input 226a. The signal at the respective one of outputs 226b or 226c is applied to the respective first input 228-1a or 228-2a of first or second modulator means 228-1 or 228-2. A second input 228-1b or 228-2b of the associated modulator means receives one of the pulse-shape in-phase (PS I) signal at input 20"e-1 or the pulse-shape quadrature-phase (PS Q) signal at input 20"e-2. The resulting modulated output appears at the associated one of modulation means outputs 228-1c or 228-2c for introduction to the associated input 196-1a or 196-2a of the associated voltage-controlled attenuator means 196-1 or 196-2. It is desired, although not required, that each of modulation means 228-1 and 228-2 be a gated modulation means, having the output 228-1c or 228-2c signal thereof present only responsive to receipt of a preselected binary logic level at one of gating CHA signal input 228-1d or gating CHB gate signal input 228-2d.

The attenuation control signal at control attenuator control input 196-1b or 196-2b is provided at the associated output 234a or 236a of an I channel comparator 234 or a Q channel comparator 236. The non-inverting input 234b or 236b of the respective I comparator 234 or Q comparator 236 is respectively connected to receive the associated one of the I-channel pulse shape (PS I) signal at input 20"e-1 or the Q-channel pulse shape (PS Q) signal at input 20"e-2. The inverting input 234c or 236c, respectively, is connected to receive the associated signal at the associated one of the outputs 204-1c or 204-2c of first and second sample-signal mixer means 204-1 or 204-2. The "reference" signal for each mixer means first signal input 204-1a or 204-2a is respectively provided by the 0° output 230a or the 90° output 230b of a quadrature power splitter means 230. The input 230c of the quadrature power splitter means is connected to the output 202b of the phase shifter 202. The phase shifter input 202a is connected to the second output 194c of the input power splitter means. The remaining mixer means signal input 204-1c or 204-2c is each connected to the associated one of the in-phase first and second outputs 232a or 232b of another power splitter means 232. The input 232c of this latter power splitter means is provided by the output of an RF amplifier means 206, receiving the sample RF signal at input 20"f. This signal is a representation of the instantaneous signal provided at amplifier means output 20"a, responsive to the amplification of the summation, in summer means 238, of the variably-attenuated in-phase I and quadrature-phase Q signals provided to respective inputs 238a and 238b thereof.

A single sideband excitation signal is generated, by combination of phase-shifted signals, directly in the power amplifier means 20"; the information modulated onto the RF carrier is the pulse shape PS signal itself, as generated by the interface means. By controlling the individual amplitude of each of the in-phase components (by means of mixer 204-1, comparator 234, gated modulator 228-1 and controlled attenuator 196-1) and the quadrature-phase component (by means of mixer 204-2, comparator 236, gated modulator 228-2 and controlled attenuator 196-2) minimum distortion can be realized by the single-sideband high-power RF signal provided at output 20"a to antenna means 16.

EXEMPLARY IMAGING AND SPECTROSCOPY METHODS FOR NMR SYSTEM WITH RF SPECTROMETER SUBSYSTEM

Referring now to FIGS. 5-9, several exemplary methods will be described for NMR imaging or NMR chemical-shift spectroscopy with an NMR system utilizing our novel RF spectrometer subsystem. It should be understood that these methods, and the particular magnetic gradient field signals, RF magnetic field signals (and gating/modulation waveforms therefor) and the like signals are presented by way of example only and are neither intended to limit the methods and/or signal waveforms utilized, nor limit the system to apparatus capable of performing only the illustrative method(s).

Figure 5:
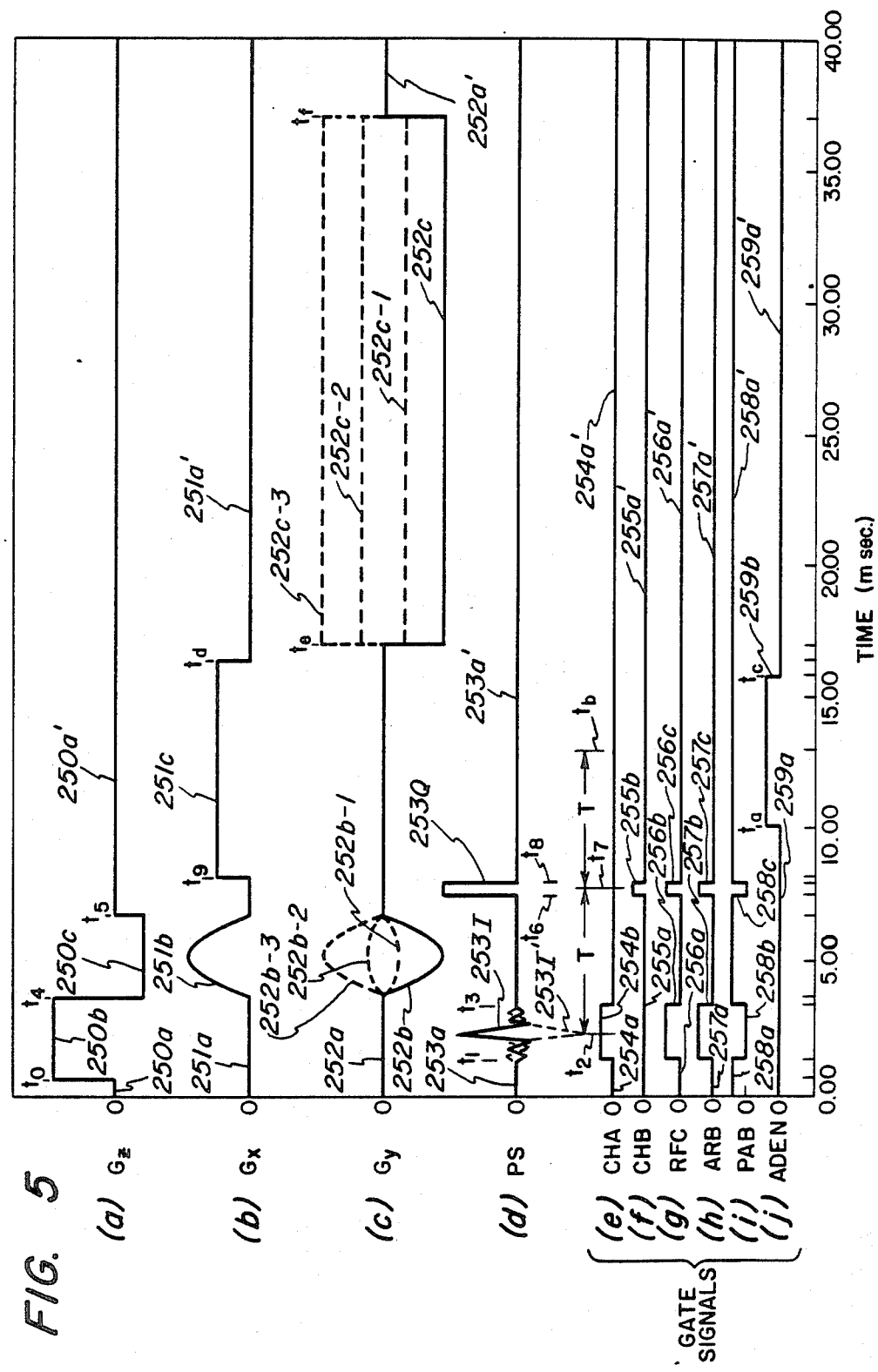
FIGS. 5-9 are graphical illustrations of the various signals typically found at various points within the system for different methods of producing NMR images and localized chemical shift spectra from anatomical samples, and illustrating use of our novel RF spectrometer subsystem.

Referring first to FIG. 5, pulse-shaping (PS) and gating (CHA, CHB, RFC, ARB, PAB and ADEN) signals to our RF spectrometer subsystem, as well as field gradient ($G_z$, $G_x$ and $G_y$) signals, for a partial-saturation two-dimensional (2D) spin-wrap imaging sequence are illustrated. While several aspects of the imaging method utilizing this sequence of signals are more fully described and claimed in U.S. Pat. No. 4,443,760, issued Apr. 17, 1984, assigned to the assignee of the present application and incorporated herein by reference in its entirety, the method may briefly be described as follows: prior to the beginning of each imaging sequence (commencing at time $t_0$), all of the gradient $G_z$, $G_x$ and $G_y$ waveforms, as well as the pulse-shaping PS waveform and the gate signal waveforms CHA, CHB, RFC, ARB, PAB and ADEN, are at an essentially zero magnitude level, as shown by waveform portions $250a$-$259a$, respectively. At first sequence commencement time $t_0$, the gradient field signal in the direction of the axis along which the constant sample slice thickness is to be provided, e.g. the $G_z$ signal for an axial slice with constant thickness in the Z-direction, is pulsed to a positive polarity level, as shown by waveform (a) portion $250b$. The actual slice selection is made responsive to a 90° RF selective excitation pulse in the presence of the gradient pulse $250b$. The spectrometer subsystem having the RF power amplifier of FIG. 4 will, for purposes of illustration, be used. After selection of the proper Larmor frequency at which to set the frequency synthesizer means 160 (FIG. 3), the 90° excitation RF pulse is provided by enabling the transmitter means I-channel with the CHA waveform portion $254b$ of waveform (e), the RF combiner RFC enabling waveform portion $256b$ of waveform (g), the RF power amplifier means ARB enabling signal portion $257b$ of waveform (h), the preamplifier blanking PAB signal portion $258b$ of waveform (i) and a non-zero pulse-shaping signal level in the I-channel, such as the waveform (d) signal portion 253I (having a sinc bt modulation envelope). The pulse-shaping I-channel modulation envelope portion 253I commences at a time $t_1$ after the sequence commencement time $t_0$ and terminates at a time $t_3$ prior to the $G_z$ gradient pulse termination time $t_4$, with the pulse-shaping PS waveform reacing a peak at a time $t_2$ substantially midway between time $t_1$ and $t_3$. The pulse-shape PS waveform is also available, as needed, in the Q-channel. Sample plane excitation is followed by an information-encoding interval (commencing at time $t_4$ and terminating at time $t_5$) during which the $G_z$ signal is provided as a negative-polarity gradient, as in portion $250c$, along with a positive $G_x$ field gradient signal portion $251b$ and a Y-direction phase-encoding field gradient pulse portion $252b$ of waveform (c). The $G_z$ portion $250c$ has a magnitude established in substantial accordance with the equation $$\tfrac{1}{2}\int_{t_1}^{T_3} G_z(t)dt = \int_{t_3}^{t_5} G_z(t)dt,$$

to facilitate rephasing of the excited nuclei spins. The waveform (b) positive $G_x$ portion $251b$ acts as an excited nuclei dephasing pulse while the phase-encoding $G_y$ pulse $252b$ is provided with a magnitude selected to encode spatial information in the Y-direction. As an RF signal is not then required, and a response signal is not then present, the pulse-shaping PS signal and all of the six spectrometer subsystem gate signals are at a substantially zero magnitude during the appearance of the three gradient pulses. Upon termination of the three-gradient-pulse period (at time $t_5$), a short time interval (until time $t_6$) is provided for the gradient signals (primarily the $G_z$ signal) to return to the substantially zero level, e.g. the final $G_z$ field gradient level $250a'$. At time $t_6$, the RF spectrometer subsystem is enabled to provide a non-selective 180° RF pulse by enabling signal portions $255b$, $256c$, $257c$ and $258c$ in the respective CHB, RFC, ARB and PAB gate signals and by a substantially-rectangular Q-channel pulse-shape PS modulation signal 253Q. The 180° non-selective RF pulse, applied in the absence of any imaging gradients $G_n$ (where n=x, y or z), served to rephase the nuclei spins dephased by inhomogeneities inherent in the main magnetic field. The 180° RF pulse signal portions 253Q, $255b$, $256c$, $257c$ and $258c$ are such as to cause the pulse to be substantially time-symmetrical about mid-time $t_7$, which is established to occur after a time interval T from the time $t_2$ at which the 90° RF selective pulse peak occurs. Responsive to RF pulse 253Q, the stimulated nuclei generate an NMR echo signal having a maximum amplitude occurring at a time 2T after the midpoint of the 90° RF selective pulse, or after a time interval T after the non-selective pulse midtime $t_7$. Prior to the occurrence of the echo peak, an X-direction gradient field $G_x$ portion $251c$ is enabled (commencing at time $t_9$) and shortly thereafter (at time $t_a$), the RF spectrometer subsystem recieves a non-zero ADEN enabling portion $259b$ of waveform (j), to begin the analog-to-digital digitization of the received signal. The spin-echo signal peak occurs at the somewhat later time $t_b$, and the spin-echo response signal diminishes to a substantially zero magnitude by a time $t_c$, at which time the ADEN digitizing enablement signal returns to the disabling final level $259a'$ and reception of the response echo signal in the RF spectrometer subsystem ceases. Shortly thereafter, at time $t_d$, the $G_x$ field gradient level falls to the substantially zero final level of portion $251a'$. It should be understood that the amplitude of the $G_x$ dephasing pulse portion $251b$ is adjusted to ensure that the received spin-echo response signal maxima occurs at the same time interval T after the middle of the non-selective pulse, as the time interval T between the midpoints of the selective and non-selective RF pulses, and the "steady" $G_x$ level of portion $251c$ is selected to maintain the phase during the spin-echo signal presence. The sequence ends with the large field gradient pulse $252c$ in either the Y-direction $G_y$ signal, as shown, or in the Z-direction $G_z$ signal; these pulses $252c$ are "spoiler"

pulses serving to destroy the phase coherence of the transverse magnetization and prepare the sample for the next application of the imaging sequence. It will be seen that all of the three field gradient signals of waveforms (a), (b) and (c) have returned to their initial, substantially zero values, in portions 250a', 251a' and 252a', respectively, and that the RF spectrometer subsystem modulation and gate signals of waveforms (d)-(j) have returned to their substantially zero levels in portions 253a'-259a', at the end of the sequence and are thus at the proper levels for the commencement of the next subsequent partial-saturation two-dimensional spin-warp imaging sequence. Thus, after the "spoiler" pulse ends at time $t_f$, a next sequence of signals 250–259 commences, with a different $G_y$ phase-encoding gradient pulse amplitude, e.g. such as different amplitudes 252b-1 through 252b-3 (shown in broken line), and associated subsequent spoiler pulses, e.g. such as spoiler pulses 252c-1 through 252c-3 (also shown in broken line), each of which may, but need not, have the same magnitude as the peak magnitude of the phase-encoding gradient pulse 252b-1 through 252b-3, associated therewith, and with the phase of the selective 90° pulses being alternated, as shown by the negative-polarity peak sinc bt pulse-shaping PS modulation waveform 253I' (shown in broken line). A total of $N_y$ different values of the $G_y$ phase-encoding gradient pulse portion 252b is utilized to provide $N_y$ sequential spin-echo reception signals, each of which is complex Fourier transformed, with respect to time, to yield a different one of $N_y$ projections. A second Fourier transform is then performed with respect to $G_y$ amplitude to generate the two-dimensional NMR image. The repetition period between applications of the illustrated sequence, i.e. the time between the commencement time $t_0$ of a first imaging sequence and a time $t_0'$ of the next subsequent imaging sequence, is adjusted to optimize the contrast for images of the spin-lattice relaxation time constant $T_1$, coordinately with optimization of the signal-to-noise ratio of the image.

The resulting image typically contains an array of 256×256 pixels (representing an area of between about 5 and about 75 cm. on each side) with a typical thickness of between about 0.5 mm. to about 15 mm.

Figure 6:
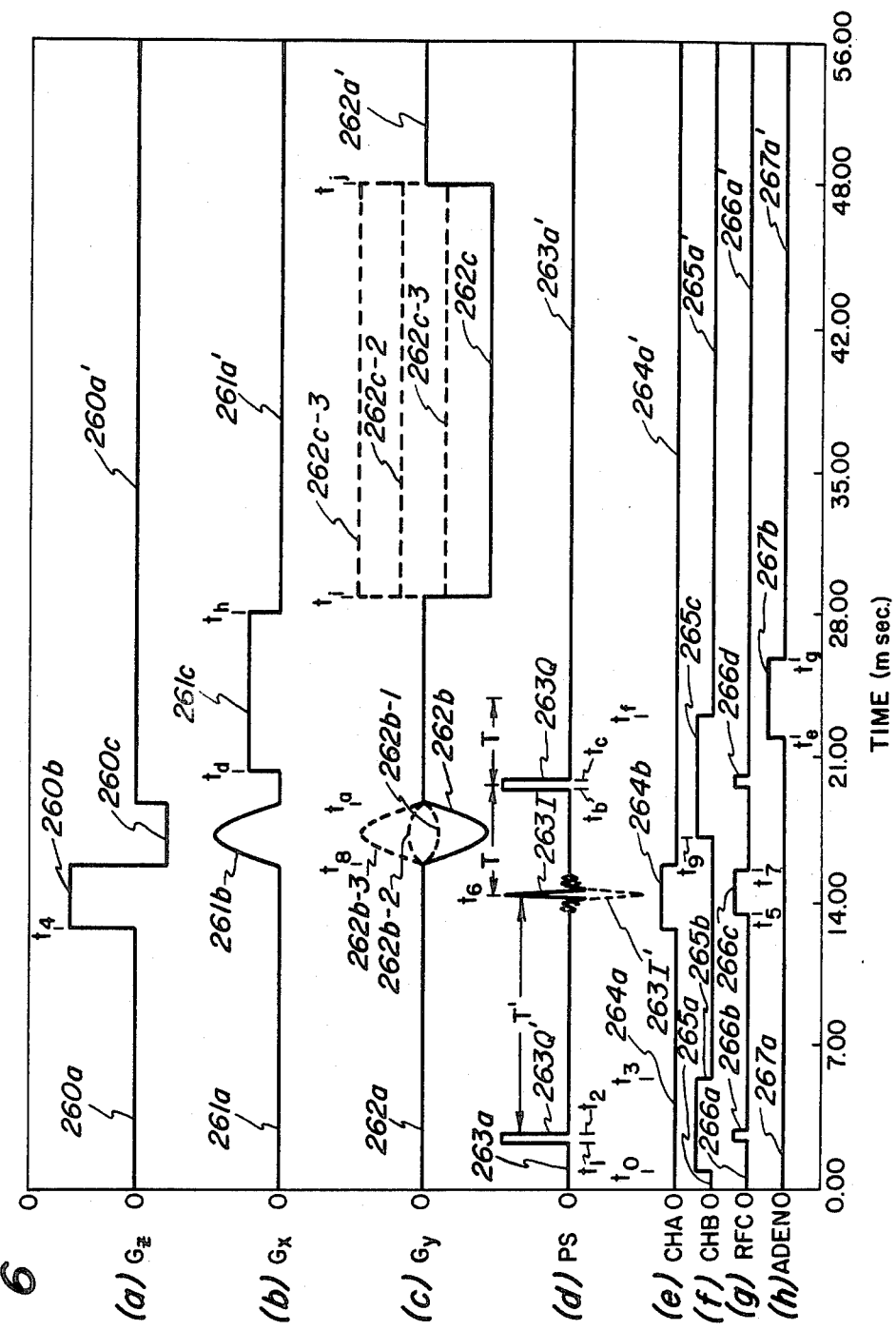

Referring now to FIG. 6, the signals for a two-dimensional inversion-recovery spin-warp imaging sequence are illustrated. The inversion-recovery sequence is substantially the same as the sequence of FIG. 5, with the exception that the RF spectrometer subsystem is commanded to provide an additional 180° non-selective RF pulse 263Q-1 applied at a time T' prior to the time $t_6$ at which the peak of the 90° selective RF pulse 263I occurs. During the time interval T', excited nuclear spins throughout the sample recover their Z-direction magnetization at a rate dependent upon the spin-lattice time constant $T_1$ of the particular nuclear spin; spin-lattice relaxation time constant $T_1$ images can be constructed by varying the time interval T' in subsequent scan sequence experiments. It will be seen that the RF spectrometer subsystem control waveforms of FIG. 6 do not show the ARB waveform, which is (as shown in FIG. 5) essentially identical to the RFC waveform in commencement, termination and magnitude of the enabling and disabling levels; it will be further seen that the preamplifier-blanking PAB signal also need not be specifically shown, as the PAB signal is the logic inverse of the RFC/ARB signal. It will be seen that the 13 individual time intervals required for the partial-saturation 2D spin-warp imaging sequence of FIG. 5 (requiring 13 interrupt-driven subsequence instruction sets to be loaded from the computer means 30) become 19 different time intervals each requiring a separate set of instructions loaded into the interface means by the computer means of the NMR imaging system. Specifically, prior to the beginning of each imaging sequence (commencing at time $t_0$), all of the gradient $G_z$, $G_x$ and $G_y$ waveforms, as well as the RF spectrometer subsystem pulse-shaping PS waveform and the gate signal waveforms CHA, CHB, RFC and ADEN, are at an essentially zero magnitude level, as shown by waveform portions 260a–267a, respectively. At a first sequence commencement time $t_0$, the second transmitter channel CHB signal waveform is provided by the interface means at the enabling high logic level, as shown by portion 265b of waveform (f). The first RF channel CHA signal waveform remains at the disabling, low logic level, as shown by waveform portion 264a, while the pulse envelope PS signal waveform portion 263a, the combiner gating RFC waveform signal portion 266a and the gradient field signal portions 260a–262a all remain at the low logic level; the analog-to-digital conversion signal portion 267a also remains at the disabling level. These various RF spectrometer subsystem input waveforms are shown in waveforms (a)–(e), (g) and (h) of FIG. 6. At some later time $t_1$, the RF combiner gate RFC signal is enabled to a high logic level, as in portion 266b, while the pulse-shaping PS signal portions 263Q' is brought to a level to initiate a non-selective 180° RF excitation pulse. This 180° RF pulse ends at time $t_2$, at which time the RFC pulse 266b also terminates. Thereafter, at a time $t_3$, the CHB signal returns to a low logic level and the transmitter means is temporarily disabled. At a later time $t_4$, the Z-axis gradient $G_z$ signal is pulsed to a positive polarity level, as shown by waveform (a) portion 260b; slightly thereafter, the first transmitter channel CHA enabling level portion 264b, of waveform (e), commences. Shortly thereafter, at a time $t_5$, the combiner RFC signal portion 266c commences, as does the pulse-shaping PS modulation signal waveform portion 263I of waveform (d); responsive to the presence of the gradient pulse 260b along with a 90° RF selective excitation pulse (illustratively of the sinc bt modulation envelope type), the desired thin slice of nuclear spins, perpendicular to the Z axis, is excited in the sample. As before, the slice thickness is dependent upon the amplitude of $G_z$ signal portion 260b and the duration ($t_7-t_5$) of the 90° pulse. The 90° RF pulse is thus provided with its peak time $t_6$ being a predetermined time interval T' from the commencement at time $t_1$ of the first 180° non-selective RF pulse (of portion 263Q') of the waveform (d) signal. Thus, after the nuclear spins in the selected sample slice have been first inverted, the recovering inverted spins are now subjected to a 90° rotation into the XY plane. This rotation into the plane of the receiving coil essentially ends at time $t_7$, when the PS signal portion 263I and the RFC portion 266c terminate. Slightly thereafter, at time $t_8$, the rephasing $G_z$ lobe 260c commences, along with the commencement of the $G_x$ signal portion 261b and the $G_y$ signal portion 262b; all of the gradient signals end at a later time $t_a$. At time $t_9$, substantially occurring at the peaks of the $G_x$ portion 261b and $G_y$ portion 262b signals, the quadrature channel CHB signal rises to an enabling level in portion 265c. Therefore, at a time $t_b$ after the gradient signals have returned to their zero-magnitude levels, the pulse-shaping PS signal portion 263Q and the RFC signal portion 266d occur to cause the RF spectrometer subsystem to provide a second non-selective 180° RF excitation pulse. This pulse terminates at a time $t_c$ such that the time interval T between the peak of the 90° selective and 180° non-selective RF pulses 263I and 263Q provides for a spin-echo at a like time interval T after the last 180° RF pulse. Prior to the occurrence of the spin-echo peak, an X-direction gradient field $G_x$ portion 261c is enabled (commencing at time $t_d$) and shortly thereafter (at time $t_e$) the spectrometer receive channel is "unblocked" and the received echo response signal is provided to the interface means, where the analog-to-digital conversion process commences, responsive to the enabling high logic level portion 267b of the ADEN signal. The digitization of the received signal terminates at time $t_g$, with the X-axis gradient signal portion 261c being terminated at a time $t_h$ thereafter; a spoiler pulse portion 262c, in the Y-axis gradient $G_y$ signal, is generated in the time interval between time $t_i$ and time $t_j$ to destroy the transverse magnetization phase coherence and to prepare the sample for the next imaging sequence, occurring at a time $t_0'$ after the last time $t_j$ of the previous sequence. As in the partial-saturation technique described with respect to FIG. 5, the inversion-recovery technique of FIG. 6 utilizes a total of $N_y$ different values of both the $G_y$ phase-encoding gradient pulse portions 262b and 262b-1 through 262-3, and the identical associated amplitude levels of spoiler portions 262c and 262c-1 through 262c-3 (both shown in broken line), to provide $N_y$ sequential spin-echo reception signals, each of which is complex Fourier transformed, with respect to time, to yield a different one of $N_y$ projections. Again, a second Fourier transform is performed with respect to the $G_y$ amplitude to generate the two-dimensional NMR image. Since the nuclei in the excited sample recover their Z-direction magnetization at a rate dependent upon the different values of spin-lattice time constant $T_1$ thereof, during the time interval T', spin-lattice $T_1$ images are constructed by varying the time interval T' in subsequent scans.

Figure 7:
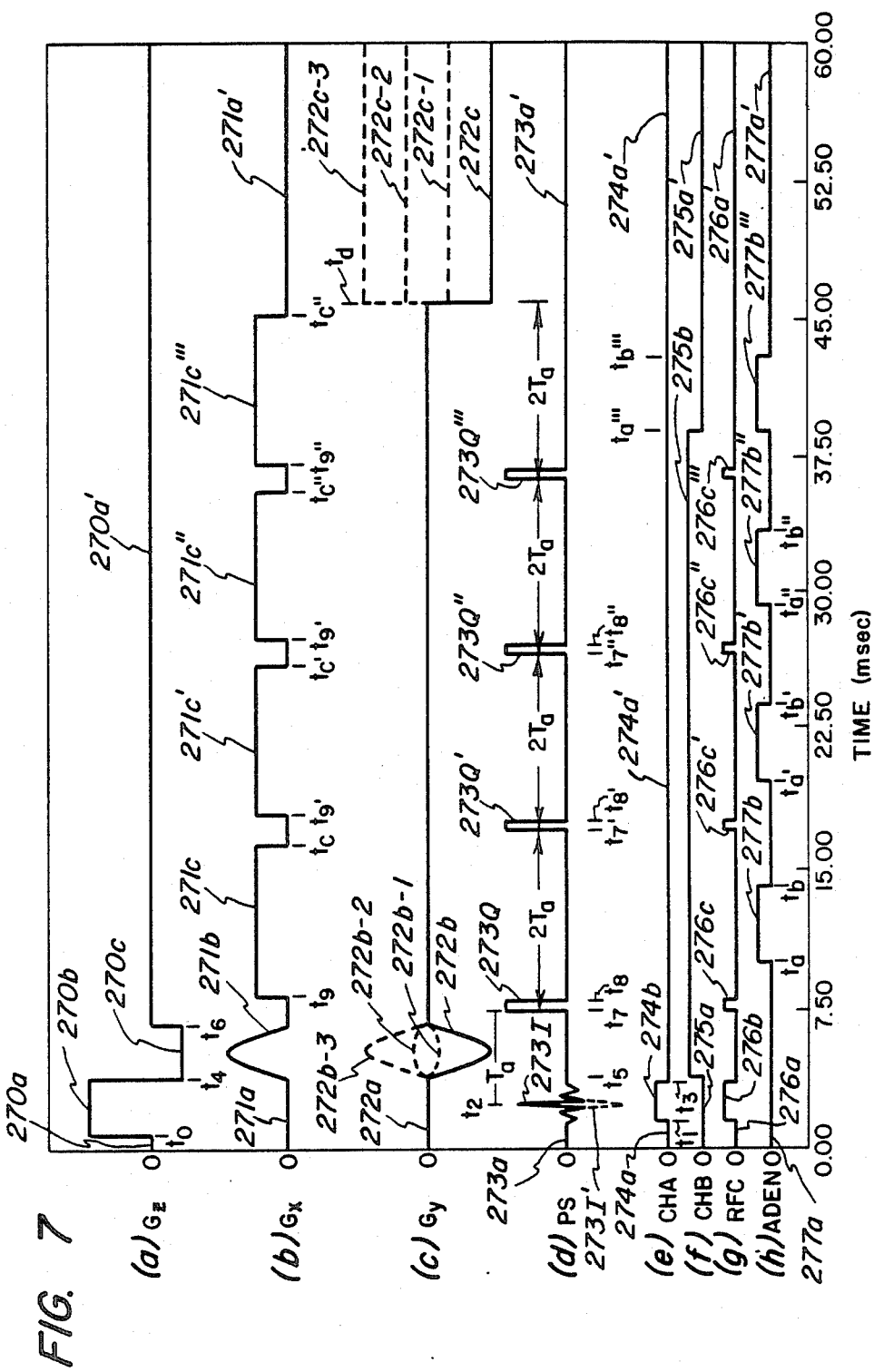

Referring now to FIG. 7, a multiple-echo 2D spin-warp imaging sequence is illustrated. In the multiple-spin-echo sequence, the RF spectrometer subsystem provides a single 90° selective RF excitation pulse, responsive to the PS signal waveform portion 273I, and then provides a plurality of subsequent 180° non-selective RF excitation pulses 273Q, 273Q', 273Q'', 273Q''', . . . , each occurring with a time interval $2T_a$ therebetween, where $T_a$ is the time interval between the peak of the 90° selective RF pulse modulation waveform (itself occurring at time $t_2$) and the commencement time of the first 180° non-selective RF excitation pulse 273Q. It will be seen that, during each sequence, a plurality of X-axis gradient field $G_x$ signal portions are repeatedly provided at the same level, as in waveform portions 271c, 271c', 271c'', 271c''', . . . , with each portion occurring immediately after the associated one of the 180° non-selective RF pulses 273Q. Similarly, reception of each of a plurality of spin echo signals, with each of a like plurality of analog-to-digital conversions being enabled by the ADEN signal portions 277b, 277b', 277b'', 277b''', . . . in each associated spin-echo time interval sequence, occurs. Thus, in the illustrated first multiple-spin-echo sequence, a total of four echoes are received and processed; the data from these multiple echoes can be averaged to increase the signal-to-noise ratio of the received information. In a next-subsequent sequence, the Y-axis $G_y$ gradient signal phase-encoding portions 272b-1 through 272b-3 are varied to other ones of the $N_y$ different levels required for formation of the complete image; the same amplitude is also utilized for each subsequent value of one of the spoiler pulses 272c-1 through 272c-3, to prepare for still further sequences. The total of $N_y$ (where $N_y=128$ or $N_y=256$ in typical image production) sequences are each complex Fourier transformed in time and the set of $N_y$ projections are again Fourier transformed with respect to $G_y$ signal amplitude to generate the two-dimensional NMR image. Additionally, a separate image can be constructed from all of the like-numbered echoes, e.g. from the first echo of each of the $N_y$ sequences, from the second echo, . . . ; the decay in image data, with respect to time, can be plotted along the horizontal axis and utilized to compute a transverse relaxation time constant $T_2$ image. It should be understood that this multiple-spin-echo sequence can be combined with an inversion recovery technique by preceding the 90° selective RF excitation pulse (generated in the interval between time $t_1$ and time $t_3$) with a 180° non-selective RF excitation pulse, in the same manner as the initial 180° pulse of the sequence of FIG. 6 preceded the 90° initial pulse of the sequence of FIG. 5.

Figure 8:
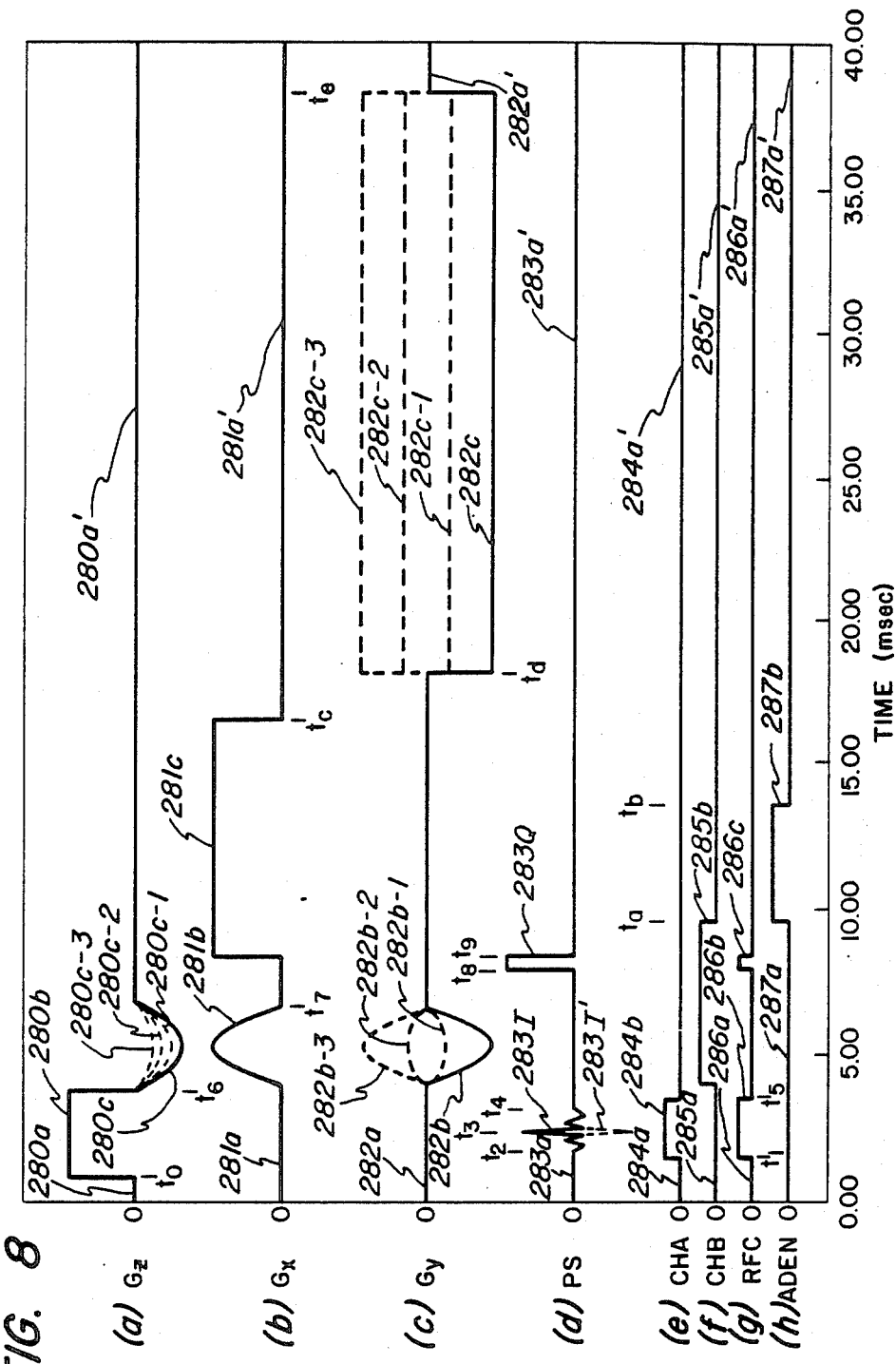

Referring now to FIG. 8, the signals for a restricted three-dimensional (3D) spin-warp imaging sequence are illustrated. It will be seen that this 3D sequence is similar to the 2D sequence of FIG. 5, with the exception of the $G_Z$ gradient signal rephasing lobe 280c (FIG. 8). The Z-axis gradient $G_Z$ signal rephasing lobe portion 280c is a combination of the rectangular rephasing lobe waveform and an additional $G_z$ phase-encoding gradient waveform, to provide the illustrated lobular signal waveform shape; this lobe is present during the time interval from time $t_6$ to time $t_7$ and is concurrent with both the $G_X$ gradient signal lobe 281b and one of the $N_y$ different amplitudes of the $G_y$ gradient signal lobes 282b, 282b-1, 282b-2, 282b-3, . . . , etc. The peak amplitude of gradient signal rephasing lobe portion 280c is (as shown by the various amplitudes of signal lobe portions 280c, 280c-1, 280c-2, 280c-3, . . . ) varied to each of $N_z$ different peak values to obtain $N_z$ different projections. Each of the $N_z$ different $G_z$ gradient signal rephasing lobe amplitude values is utilized with a full range of the $N_y$ peak values for the $G_y$ gradient signal lobes 282b through 282b-3 (and the associated "spoiler" pulse amplitudes 282c through 282c-3). At least $N_y \cdot N_z$ independent projections, utilizing $N_y \cdot N_z$ permutations of the $G_y$ and $G_z$ phase-encoding gradient signals must be collected to reconstruct a three-dimensional image by the 3D Fourier transform (3DFT) method; the data is transformed with respect to: time, $G_y$ amplitude and $G_z$ amplitude. It should be understood that all $N_y$ values of the $G_y$ gradient signal lobes may be sequentially provided for each $G_z$ gradient signal lobe value, or that each of the $N_z$ values of $G_z$ phase-encoding gradient signal lobe 280c may be provided sequentially for each value of the $G_y$ gradient signal phase-encoding lobe 282b, or that any other sequence of the $N_y$ phase-encoding $G_y$ gradient signal lobes and $N_z$ phase-encoding $G_z$ gradient signal lobes can be utilized, as long as the computer means 30 has been previously programmed to assign the acquired image data for any particular combination of $G_z$ and $G_y$ signal amplitudes to the appropriate cell of the total data matrix. After collection of at least the $N_y \cdot N_z$ independent projections, the data array (having a like number of $N_y \cdot N_z$ cells) is filled and the 3DFT processing (with respect to time, $G_y$ amplitude and $G_z$ amplitude) is carried out to provide a set of imaging data which can be displayed as a sequence of images with either the Y-axis or Z-axis value varying across the range for which data was taken. It should be understood that the initial 90° selective RF pulse, provided during the time interval between time $t_2$ and time $t_4$ of each of the $N_y \cdot N_z$ sequences, may be so established as to selectively excite all of the nuclei in a relatively thick slab (in the Z direction) of the sample to be imaged, and can be further established to define the number $N_z$ of Z-axis slices to be much less than the number $N_y$ of the Y-axis-parallel columns in each of the $N_z$ planes. It should be further understood that the restricted three-dimensional imaging sequence can be combined with inversion recovery techniques, such as that previously shown in FIG. 6, or with multiple-echo techniques, such as that previously shown in FIG. 7, by causing the RF spectrometer subsystem to either add other 180° non-selective RF pulses either before or after the 90° selective excitation pulse 283I or 283I' in each sequence, or to the 180° non-selective Rf pulses both before and after the 90° selective RF pulse of each sequence. In this manner, a restricted three-dimensional set of images can be obtained with proton distribution, $T_1$-weighted, $T_2$-weighted and the like information, and can be so obtained either with or without signal averaging as provided by multiple-echo techniques.

Figure 9:
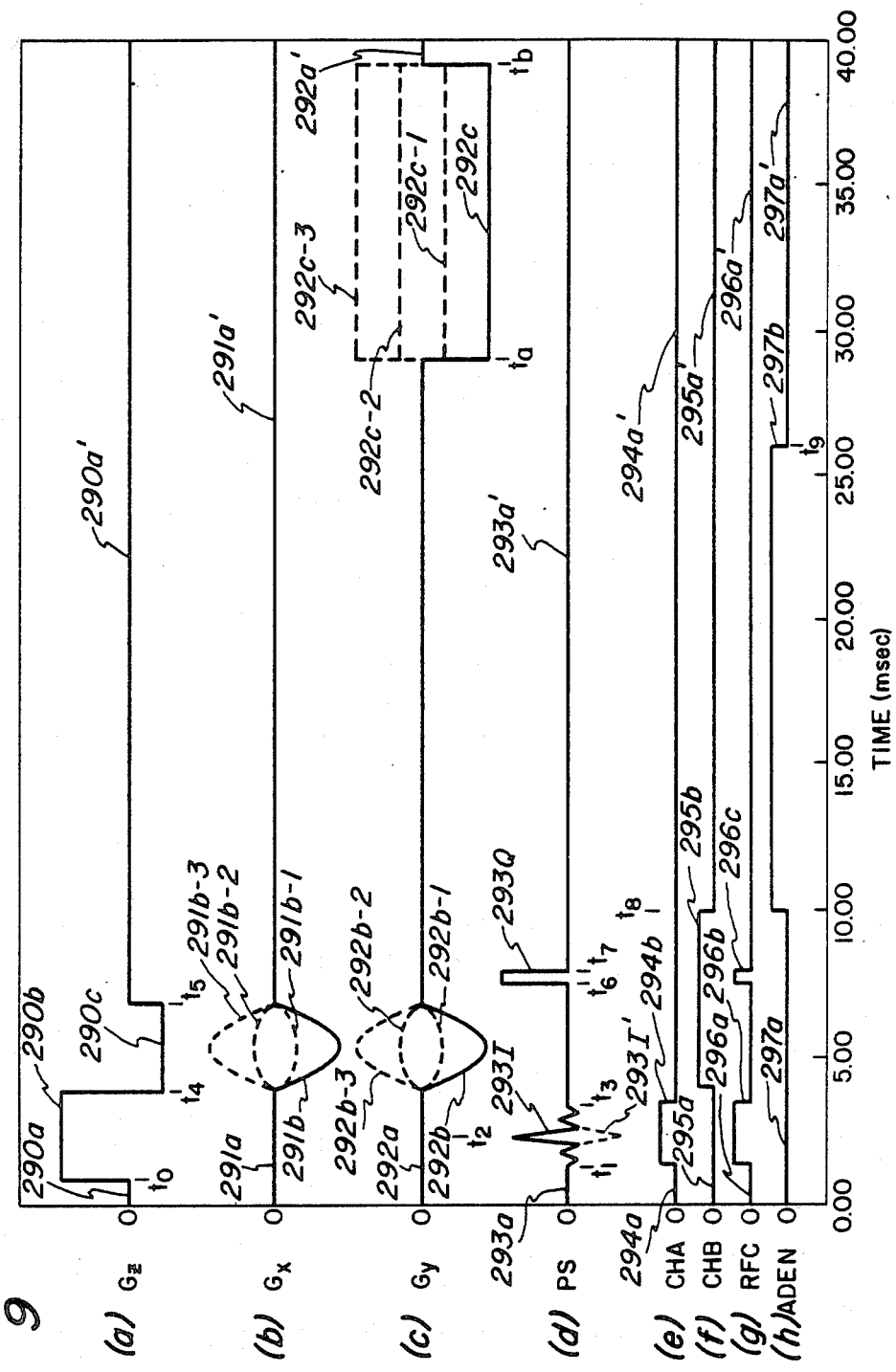

Referring now to FIG. 9, the various system signals for one presently preferred embodiment of a chemical-shift spectroscopic imaging sequence are illustrated. The spectroscopic imaging signal waveforms 290–297 are a modified set of the basic two-dimensional imaging sequence as previously described for FIG. 5. It will be seen, however, that the use of an X-axis gradient field $G_x$ signal is eliminated during the data acquisition time interval, when the RF spectrometer subsystem receiver is unblocked and conversion of the response RF signal occurs because the ADEN signal portion 297b is at a high logic level (between times $t_8$ and $t_9$). A phase-encoding $G_x$ gradient field signal lobe 291b (or a sequence-dependent one of a plurality of different magnitude lobes 291b and 291b-1 through 291b-3) is utilized instead. That one of the $G_x$ gradient signal lobes 291b, 291b-1, 291b-2, 291-3, . . . , then in use for the particular sequence, is present during the same time interval, from time $t_4$ to time $t_5$, during which the $G_z$ gradient signal rephasing lobe 290c and the $G_y$ gradient signal phase-encoding lobes 292b are present. It will also be noted that the data acquisition time interval (e.g. between time $t_8$ and time $t_9$) is increased, relative to the basic imaging sequence, to enable improved frequency resolution of the received image data to be obtained.

To provide a two-dimensional chemical-shift spectroscopic image, a total of $N_x$ different amplitudes of the $G_x$ gradient signal phase-encoding lobes 291b are utilized, along with $N_y$ different amplitudes of the $G_y$ gradient signal phase-encoding lobes 292b. Thus, the spatial information in the two-dimensional slice is reconstructed by the 2DFT of the $N_x \cdot N_y$ individual response signals, provided by the like number of independent projections using a like number of different permutations of the $G_x$ and $G_y$ gradient field signal lobe amplitudes. A third Fourier transform is performed upon the two-dimensional spatial image information matrix, with respect to data acquisition time, to provide the chemical-shift spectroscopic information at each point in the two-dimensional imaging plane. It should be understood, as with the three-dimensional imaging sequences of FIG. 8, that the chemical-shift spectroscopic imaging sequences of FIG. 9 can be combined with inversion recovery techniques, by causing the RF spectrometer subsystem to add a 180° non-selective RF signal pulse prior to the 90° selective RF excitation pulse 293I or 293I', at the beginning of each sequence, or can be combined with three-dimensional imaging techniques, by providing a phase-encoding $G_z$ gradient signal lobe in place of the illustrated rectangular rephasing lobe 290c, in addition to the phase-encoding $G_x$ and $G_y$ gradient signal lobes 291b and 292b, respectively. It should also be understood that in the absence of chemical-shifts, i.e. if the imaging volume contains a homogeneous sample, the use of the chemical-shift spectroscopic imaging sequence of FIG. 9 will reveal the magnetic field non-homogeneity in the imaging plane, allowing the magnetic field nonhomogeneity to be measured as variations in the NMR response signal frequency, with respect to position in that imaging plane; this technique is particularly useful for initial balancing of the magnetic field of the superconducting magnet means.

While several presently preferred embodiments of our novel RF spectrometer subsystem for a nuclear magnetic resonance imaging and spectroscopy system, and several presently preferred embodiments of methods for utilizing that system and subsystem to acquire image data from a sample, have been described in some detail herein, many variations and modification will now become apparent to those skilled in the art. It is our intent, therefore, to be limited only by the scope of the appending claims and not by way of the specific details and instrumentalities presented by way of description of the presently preferred embodiments herein.

What we claim is:

1. A radio-frequency (RF) spectrometer subsystem, for a nuclear magnetic resonance system for the production of images and localized chemical-shift spectra from a non-ferromagnetic sample, said system having antenna means for providing an RF magnetic field within a magnet means bore and in the sample when contained therein, responsive to a modulated radio-frequency excitation signal, and also for receiving radio-frequency energy re-radiated from the sample for forming a response signal, said subsystem comprising:

transmitter means for providing a first signal with at least a desired amplitude characteristic and a desired frequency characteristic responsive to at least one control signal from said system;

means for amplifying said first signal to the amplitude required of said excitation signal;

linearizing means coupled to said amplifying means for minimizing any change in the relative characteristics of any portion, with respect to any other portion, of the excitation signal, to the relative characteristics of the same portions of a selected one of said at least one control signal and said first signal;

means for providing at least one reference signal for obtaining at least one of phase information from, noise reduction in and/or coherent detection of, the received response signal; and means for then converting the received response signal to at least one video signal for analysis.

2. The subsystem of claim 1, further comprising: means for utilizing a single RF antenna for both transmission of an excitation signal and reception of associated response signals.

3. The subsystem of claim 2, wherein said utilizing means includes: T/R means for coupling said single antenna to said converting means for signal reception at all times when said excitation signal is not present and for automatically coupling said excitation signal to, and decoupling said converting means from, said antenna only when said excitation signal is present at said T/R means.

4. The subsystem of claim 3, wherein said utilizing means includes only passive elements.

5. The subsystem of claim 1, wherein said providing means includes synthesizer means for providing said at least one reference signal at an essentially constant Larmor frequency selected responsive to digital data provided by said system.

6. The subsystem of claim 5, wherein said synthesizer means also provides a signal at said Larmor frequency to said transmitter means for establishing a center frequency of said first signal.

7. The subsystem of claim 1, further comprising a secondary antenna for providing a feedback signal to the linearizing means, for minimizing amplitude non-linearities in the RF magnetic field produced by said excitation signal.

8. The subsystem of claim 7, wherein said linearizing means includes: means for heterodyning said feedback signal with a portion of said first signal to provide a recovered pulse signal; means for comparing the magnitude of said recovered pulse signal and the at least one control signal to provide an error signal; and means, positioned between said transmitter means and said amplifying means, for varying the attenuation to which said first signal is subjected, responsive to said error signal, to control the amplitude of said RF magnetic field.

9. The subsystem of claim 8, further comprising means for shifting the phase of the portion of said first signal provided to said heterodyning means.

10. The subsystem of claim 9, wherein said phase shift is selectable in N increments, where N is an integer greater than one.

11. The subsystem of claim 10, wherein each of the N increments is substantially equal.

12. The subsystem of claim 8, wherein said heterodyning means comprises: a balanced mixer; and means for minimizing the magnitude of the first signal fed through to the recovered pulse signal output of the mixer.

13. The subsystem of claim 12, further comprising: means for buffering at least one of the recovered pulse signal and the at least one control signal prior to comparison thereof.

14. The subsystem of claim 7, wherein said providing means includes synthesizer means for providing a signal at said Larmor frequency through said transmitter means for establishing a center frequency of said first signal; and said linearizing means includes: first and second heterodyning means, each receiving said Larmor frequency signal from said synthesizer means, a first one of said mixing means also receiving a portion of said first signal for providing a first heterodyned pulse signal, the second of said heterodyning means receiving said feedback signal for providing a second heterodyned pulse signal; means for comparing the magnitudes of said first and second heterodyned pulse signals to provide an error signal; and means, positioned between said transmitter means and said amplifying means, for varying the attenuation to which said first signal is subjected, responsive to said error signal, to control the amplitude of said RF magnetic field.

15. The subsystem of claim 14, further comprising means for shifting the phase of the portion of said first signal provided to said heterodyning means.

16. the subsystem of claim 7, wherein said linearizing means comprises: first power splitting means, receiving said first signal, for providing first and second output signals each substantially in-phase with the other; second power splitter means, receiving said feedback signal, for providing first and second output signals each substantially in-phase with the other; third and fourth power splitter means, each receiving one of said first splitter means first and second output signals, for providing first and second output signals each in phase-quadrature with the other; first and second mixer means, each receiving one of the in-phase feedback signals from an associated respective one of said second splitter means first and second outputs and each receiving one of the phase-quadrature first signals from an associated one of the first and second outputs of said third power splitter means, for, respectively, generating an in-phase intermediate-frequency signal and a quadrature-phase intermediate-frequency signal; third and fourth mixer means, each receiving an associated respective one of the phase-quadrature first and second outputs of said fourth splitter means and each receiving an associated respective one of in-phase and quadrature-phase pulse-shape PS video signals from said system, for respectively generating a first pulsed carrier signal and a second pulsed carrier signal; first comparator means receiving said in-phase intermediate-frequency signal and said in-phase PS video signal for providing an in-phase channel error signal; second comparator means, receiving said quadrature-phase intermediate-frequency signal and said quadrature-phase PS video signal, for providing a quadrature-phase channel error signal; first and second controlled-attenuation means, each receiving an associated respective one of the in-phase and quadrature-phase video signals and and an associated respective one of the respective in-phase and quadrature-phase channel error signals, for providing first and second independent adjusted-amplitude signals; and means for combining said first and second independent signals to provide the input signal to said amplifying means.

17. The subsystem of claim 1, wherein said transmitter means comprises: means, receiving a Larmor frequency signal, for providing first and second portions of said Larmor frequency signal in phase-quadrature with one another; means for receiving said at least one control signal as a variable-amplitude in-phase pulse-shape PS-I signal for a first I channel, a quadrature-phase variable-amplitude pulse-shape PS-Q signal for a second Q channel, an in-phase I channel gating signal CHA and a quadrature-phase channel gating signal CHB, from said system; first gated modulator means, receiving said PS-I and CHA signals and receiving a first RF signal responsive to said first Larmor frequency signal portion, for generating a first output signal which is present at an essentially non-zero value only if said CHA signal is present at an essentially non-zero value and is then present with an amplitude responsive to the amplitude of said PS-I signal; second gated modulator means, receiving said PS-Q and CHB signals and receiving a second RF signal responsive to said second Larmor frequency signal portion, for generating a second output signal which is present at an essentially non-zero value only if said CHB signal is present at an essentially non-zero value and is then present with an amplitude responsive to the amplitude of said PS-Q signal; and means for combining said first and second output signals to provide said first signal.

18. The subsystem of claim 17, wherein said combining means receives a gating RFC signal, and provides said first signal at an essentially non-zero value only when said RFC signal is present at an essentially non-zero value.

19. The subsystem of claim 18, further comprising first and second RF amplifier means each receiving an associated respective one of the in-phase and quadrature-phase first and second Larmor frequency signal portions and each receiving the associated respective one of said CHA and CHB channel gating signals, for respectively providing one of said first and second RF signals to said first and second gated modulator means only when the associated respective one of said CHA and CHB signal is present at an essentially non-zero value.

20. The subsystem of claim 17, further comprising first and second RF amplifier means each receiving an associated respective one of the in-phase and quadrature-phase first and second Larmor frequency signal portions and each receiving the associated respective one of said CHA and CHB channel gating signals, for respectively providing one of said first and second RF signals to said first and second gated modulator means only when the associated respective one of said CHA and CHB signal is present at an essentially non-zero value.

* * * * *

UNITED STATES PATENT AND TRADEMARK OFFICE
CERTIFICATE OF CORRECTION

PATENT NO. : 4,694,254

DATED : September 15, 1987

INVENTOR(S) : Vatis, et al.

It is certified that error appears in the above-identified patent and that said Letters Patent is hereby corrected as shown below:

Cover page, [75] Inventors: Dimitrios Vatis; Lowell S. Smith; William A. Edelstein, all of Schenectady, N.Y.

Signed and Sealed this

Twenty-third Day of February, 1988

Attest:

DONALD J. QUIGG

*Attesting Officer*   *Commissioner of Patents and Trademarks*